US010283470B2

(12) United States Patent
Lin et al.

(10) Patent No.: US 10,283,470 B2
(45) Date of Patent: May 7, 2019

(54) SEMICONDUCTOR PACKAGE AND MANUFACTURING METHOD THEREOF

(71) Applicant: Taiwan Semiconductor Manufacturing Co., Ltd., Hsinchu (TW)

(72) Inventors: Chih-Wei Lin, Hsinchu County (TW); Shing-Chao Chen, Hsinchu County (TW); Ching-Hua Hsieh, Hsinchu (TW); Chen-Hua Yu, Hsinchu (TW); Chung-Shi Liu, Hsinchu (TW); Meng-Tse Chen, Pingtung County (TW); Sheng-Hsiang Chiu, Tainan (TW); Sheng-Feng Weng, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/599,480

(22) Filed: May 19, 2017

(65) Prior Publication Data

US 2018/0337149 A1 Nov. 22, 2018

(51) Int. Cl.
| H01L 23/28 | (2006.01) |
| H01L 23/00 | (2006.01) |
| H01L 23/31 | (2006.01) |
| H01L 21/56 | (2006.01) |
| H01L 21/768 | (2006.01) |
| H01L 23/498 | (2006.01) |
| H01L 21/48 | (2006.01) |
| H01L 23/538 | (2006.01) |

(52) U.S. Cl.
CPC ............ *H01L 24/05* (2013.01); *H01L 21/486* (2013.01); *H01L 21/56* (2013.01); *H01L 21/76885* (2013.01); *H01L 23/3107* (2013.01); *H01L 23/49816* (2013.01); *H01L 23/5389* (2013.01); *H01L 24/03* (2013.01); *H01L 2224/05008* (2013.01)

(58) Field of Classification Search
CPC ....... H01L 2224/97; H01L 2224/32145; H01L 2924/181; H01L 2225/1058; H01L 23/49827; H01L 21/486; H01L 23/5384
USPC .................. 257/686, 777, 778; 438/108, 127
See application file for complete search history.

(56) References Cited

U.S. PATENT DOCUMENTS

| 8,482,134 | B1 * | 7/2013 | Darveaux ............... H01L 24/16 257/686 |
| 8,957,530 | B2 * | 2/2015 | Shim, II ............. H01L 21/6835 257/686 |
| 9,000,584 | B2 | 4/2015 | Lin et al. |
| 9,048,222 | B2 | 6/2015 | Hung et al. |
| 9,048,233 | B2 | 6/2015 | Wu et al. |

(Continued)

*Primary Examiner* — S. V. Clark
(74) *Attorney, Agent, or Firm* — JCIPRNET

(57) ABSTRACT

A semiconductor package and a manufacturing method for the semiconductor package are provided. The semiconductor package includes a chip, a molding compound, and a dielectric layer. The chip has a connector thereon. The molding compound encapsulates the chip, wherein a surface of the molding compound is substantially lower than an active surface of the chip. The dielectric layer is disposed over the chip and the molding compound, wherein the dielectric layer has a planar surface, and a material of the dielectric layer is different from a material of the molding compound.

20 Claims, 27 Drawing Sheets

(56) References Cited

U.S. PATENT DOCUMENTS

| | | |
|---|---|---|
| 9,064,874 B2 | 6/2015 | Edelstein et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2010/0140771 A1* | 6/2010 | Huang ............ H01L 21/6835 257/686 |
| 2015/0179616 A1* | 6/2015 | Lin ................ H01L 25/50 257/773 |

\* cited by examiner

US 10,283,470 B2

SEMICONDUCTOR PACKAGE AND MANUFACTURING METHOD THEREOF

BACKGROUND

Developments of the three-dimensional integration technology for wafer level packaging are underway to satisfy the demands of size reduction, high performance interconnects and heterogeneous integration for high-density integration packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
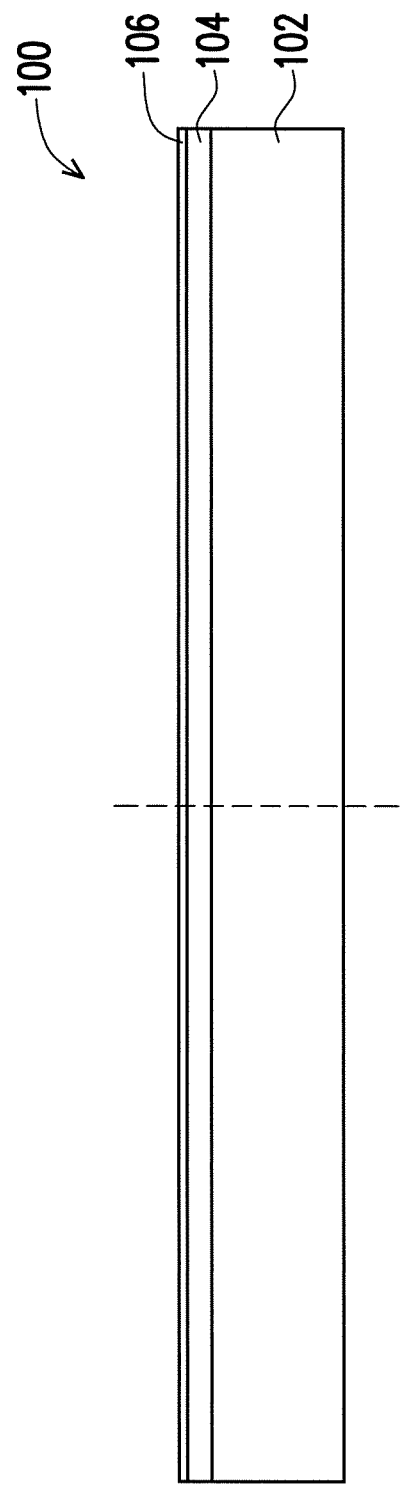
FIG. 1A to FIG. 1I are schematic cross sectional views of various stages in a manufacturing method of a semiconductor package according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

FIG. 1A to FIG. 1I are schematic cross sectional views of various stages in a manufacturing method of a semiconductor package according to some exemplary embodiments. In exemplary embodiments, the semiconductor manufacturing method is part of a packaging process. In some embodiments, two chips or dies are shown to represent plural chips or dies of the wafer, and one or more packages 10 are shown to represent plural semiconductor packages obtained following the semiconductor manufacturing method.

Referring to FIG. 1A, in some embodiments, a carrier 102 with a buffer layer 104 coated thereon is provided, the carrier 102 may be a glass carrier or any suitable carrier for carrying a semiconductor wafer or a reconstituted wafer for the manufacturing method of the semiconductor package. In some embodiments, the buffer layer 104 includes a debond layer and the material of the debond layer may be any material suitable for bonding and debonding the carrier 102 from the above layers or wafer disposed thereon. In some embodiments, the buffer layer 104 includes, for example, a light-to-heat conversion ("LTHC") layer, and such layer enables room temperature debonding from the carrier by applying laser irradiation. Referring to FIG. 1A, in some embodiments, the buffer layer 104 includes a dielectric layer made of a dielectric material including benzocyclobutene ("BCB"), polybenzooxazole ("PBO"), or any other suitable polymer-based dielectric material. In certain embodiments, a seed layer 106 is formed on the buffer layer 104. In some embodiments, the seed layer 106 includes one or more metal layers formed by sputtering or deposition.

Figure 1B:
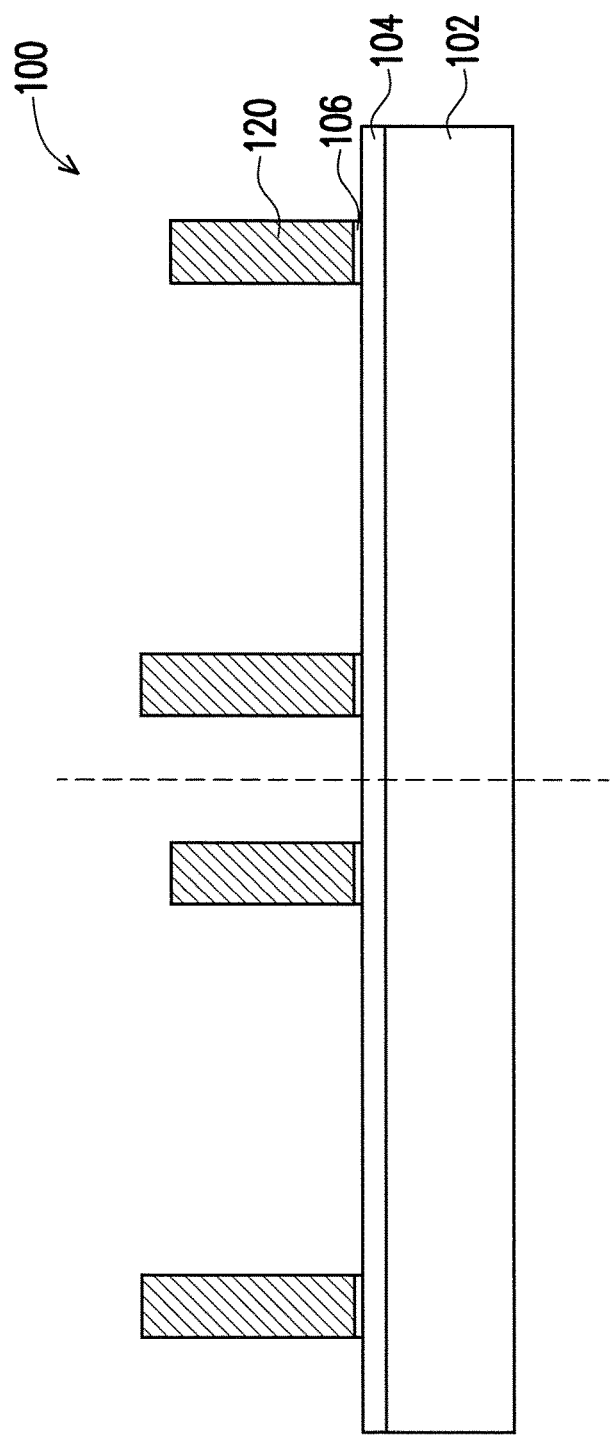

Referring to FIG. 1B, in some embodiments, through interlayer vias ("TIVs") 120 are formed on the buffer layer 104 over the carrier 102. In some embodiments, the TIVs 120 are through integrated fan-out ("InFO") vias. In some embodiments, the TIVs 120 may have different heights. In some embodiments, the formation of the TIVs 120 includes forming a mask pattern (not shown) with openings on the seed layer 106 partially exposing the seed layer 106, then forming a metallic material (not shown) filling up the openings by electroplating or deposition, and removing the mask pattern to form the TIVs 120 on the seed layer 106. The seed layer 106 is partially removed or patterned using the TIVs 120 as the mask so that the seed layer 106 located between the TIVs 120 and the buffer layer 104 is remained. The material of the seed layer 106 varies depending on the material of the later-formed TIVs. In certain embodiments, the seed layer 106 (in FIG. 1A) is formed by sequentially sputtering a titanium layer and a copper seed layer (not shown) over the buffer layer 104 on the carrier 102, while the TIVs 120 are subsequently formed by electroplating the metallic material (such as copper or a copper alloy) to fill the openings of the mask pattern. In some embodiments, the titanium layer is formed between the copper seed layer and the buffer layer 104. However, it is appreciated that the scope of this disclosure is not limited to the materials and descriptions disclosed above.

Figure 1C:
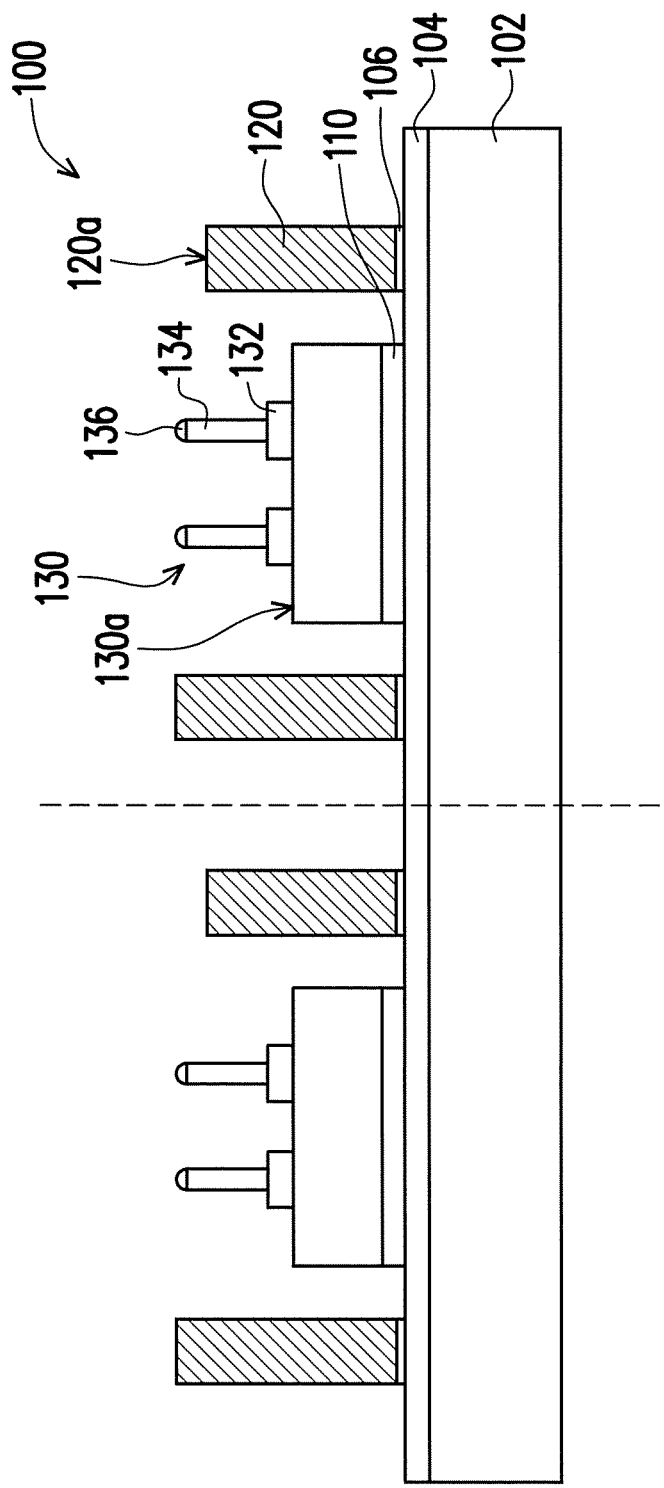

Referring to FIG. 1C, first chips 130 are provided and disposed on the exposed buffer layer 104 on the carrier 102. In exemplary embodiments, the first chips 130 may include the same types of chips or different types of chips and may be digital chips, analog chips or mixed signal chips, such as application-specific integrated circuit ("ASIC") chips, sensor chips, wireless and radio frequency chips, memory chips, logic chips or voltage regulator chips. In some embodiments, the first chip 130 includes pads 132 on an active surface 130a and metal posts 134 located on the pads 132. In some embodiments, a height difference may be formed between the metal posts 134 and the TIVs 120. In exemplary embodiments, the pads 132 are aluminum contact pads. In one embodiment, the metal posts 134 are copper posts or copper alloy posts having a height ranging from about 20 microns to about 25 microns measuring from the active surface 130a to its own top surface, for example. In certain embodiments, solders 136 may further be included and disposed on top of the metal posts 134 as shown in FIG. 1C, wherein the pads 132, the metal posts 134 and the solders 136 are collectively referred to as connectors. In certain embodiments, backsides of the first chips 130 are attached to the carrier 102, and a die attach film 110 may be disposed between the backside of the first chip 130 and the buffer layer 104 for better attachment. In some embodiments, before placing the first chips 130 on the carrier 102, the metal posts 134 along with the solders 136 on the first chips 130 are uncovered (i.e., bare dies without being molded or encapsulated) and the die attach film 110 is attached to the backside of the first chip 130. In some embodiments, the first chips 130 are placed over the carrier 102 and arranged aside the TIVs 120 (within the area surrounding by the TIVs). In some embodiments, as shown in FIG. 1C, the dotted line represents a cutting line of the whole package 100 in the subsequent cutting process and some of the TIVs 120 are arranged close to but not on the cutting line, and are arranged aside or around the first chips 130.

Figure 1D:
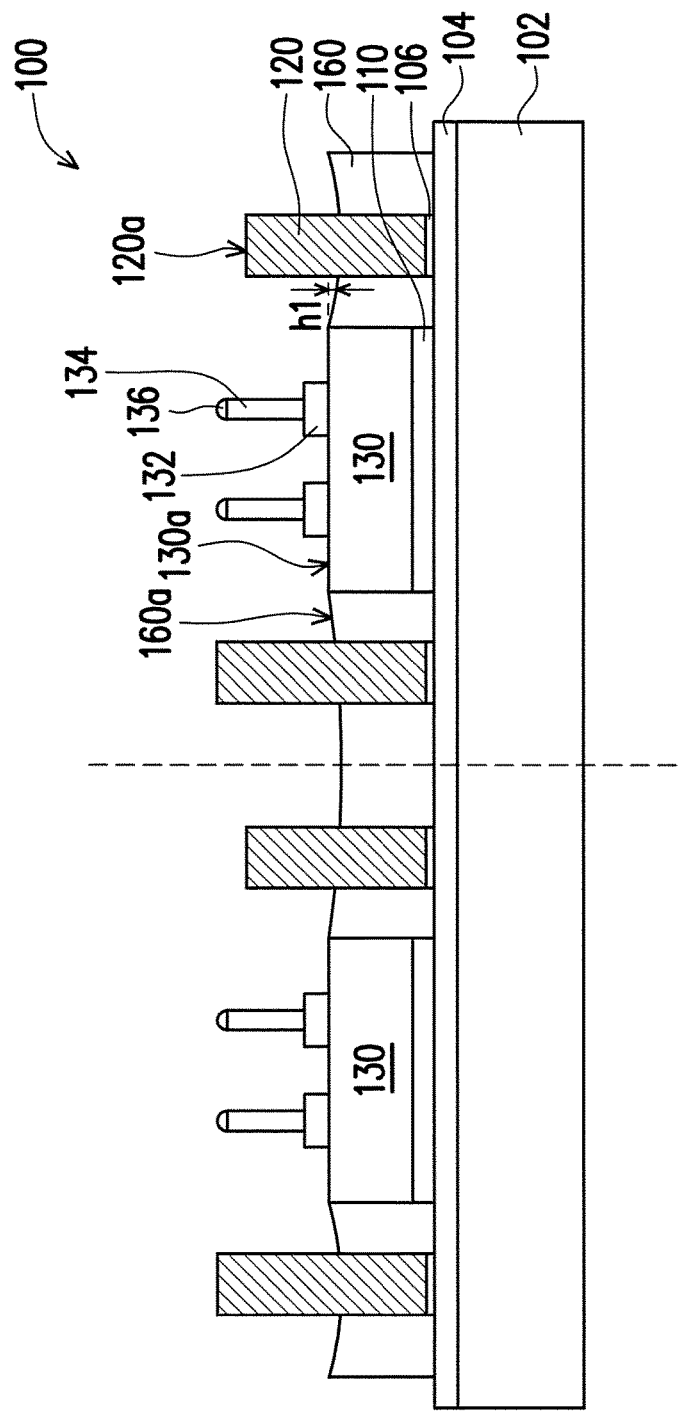

Referring to FIG. 1D, a molding compound 160 is formed over the carrier 102, and the first chips 130 on the buffer layer 104 and a portion of the TIVs 120 located over the carrier 102 aside the first chips 130 are encapsulated in the molding compound 160. A top surface 160a of the molding compound 160 is substantially lower than the active surfaces 130a of the first chips 130. In some embodiments, the molding compound 160 covers the buffer layer 104 and fills between the first chips 130 and the TIVs 120. In exemplary embodiments, the molding compound 160 is formed by using a mold chase (not shown) with a release film (not shown) attached to its inner surface to cover the active surfaces 130a of the first chips 130 and top portions of the TIVs 120 but with lateral sides of the first chips 130 and bottom portions of the TIVs 120 being exposed. That is, the top surface 160a of the molding compound 160 is lower than the active surfaces 130a of the first chips 130, lower than the top surfaces 120a of the TIVs 120, lower than the solders 136 and lower than the metal posts 134. In one embodiment, the top surface 160a of the molding compound 160 has a dish-like depression due to the pressure from the release film. In one embodiment, the height difference h1 (i.e., the distance relative to the carrier 102) between the molding compound 160 and the first chip 130 (i.e., the height difference between the top surface 160a and the active surface 130a) ranges from about 1 micron to about 20 microns. As shown in FIG. 1D, the molding compound 160 does not cover the metal posts 134 and the solders 136, and the metal posts 134, the solders 136 and the top portions of the TIVs 120 are exposed from the molding compound 160. That is, the metal posts 134 (and the solders 136) and the top portions of the TIVs 120 and are protruded from the top surface 160a of the molding compound 160. In one embodiment, the material of the molding compound 160 includes at least one type of filler-containing resins and the resins may be epoxy resins, phenolic resins or silicon-containing resins. In exemplary embodiment, the fillers are made of non-melting inorganic materials and the fillers include metal oxide particles, silica particles or silicate particles with the average particle size ranging from about 3 microns to about 20 microns, from about 10 microns to about 20 microns or ranging from about 15 microns to about 20 microns. The surface roughness or surface flatness of the cured molding compound varies depending on fine or coarse filler particles added in the molding compound material. If a planarization process is performed on the molding compound, some pits may be formed in the molding compound due to the removal of the fillers, resulting in relatively large surface roughness or even unevenness and possible connection failure.

Figure 1E:
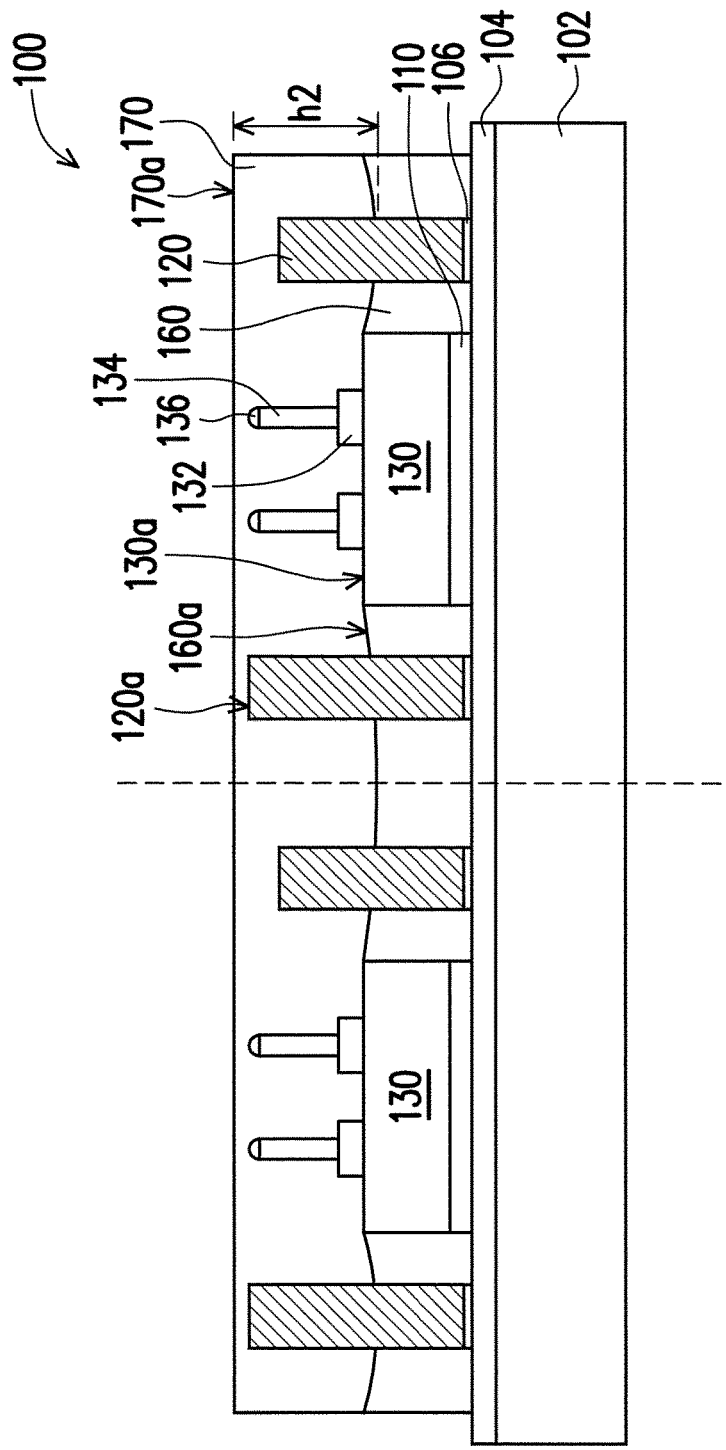

Referring to FIG. 1E, a dielectric layer 170 is formed on the molding compound 160. A material of the dielectric layer 170 is different from a material of the molding compound 160, and the dielectric layer 170 contains no fillers. As shown in FIG. 1E, the dielectric layer 170 is formed over the molding compound 160, the active surfaces 130a of the first chips 130 and the top portions of the TIVs 120 exposed from the molding compound 160, so that the entirety of the TIVs 120, the first chips 130 and the metal posts 134 and solders 136 thereon are encapsulated collectively by the molding compound 160 and the dielectric layer 170. In some embodiments, the top portions of the TIVs 120 and the metal posts 134 (and the solders 136) are encapsulated by the dielectric layer 170. In some embodiments, the thickness (or height h2) of the dielectric layer 170 (measuring from the top surface 160a of the molding compound 160 to a top surface 170a of the dielectric layer 170) ranges from about 10 microns to about 15 microns, for example. That is, the top surface 170a of the dielectric layer 170 is higher than the top surfaces 120a of the TIVs 120 and the solders 136 and higher than the top surfaces of the metal posts 134 and the first chips 130 relative to the carrier 102. In exemplary embodiments, the material of the dielectric layer 170 includes a polymeric material free of fillers and the polymeric material is selected from low-temperature curable polyimide (PI) materials, high-temperature curable polyimide (PI) materials, photosensitive or non-photosensitive dry film materials, epoxy resins, benzocyclobutene, polybenzo-oxazole, or any other suitable dielectric material. As the material of the dielectric layer 170 does not contain fillers and has better flow ability, the dielectric layer 170 can offer better coverage and filling capability over the underlying elements and the molding compound 160, leading to better surface flatness and structural integrity and strength for the composite structure of the molding compound 160 and the dielectric layer 170.

Figure 1F:
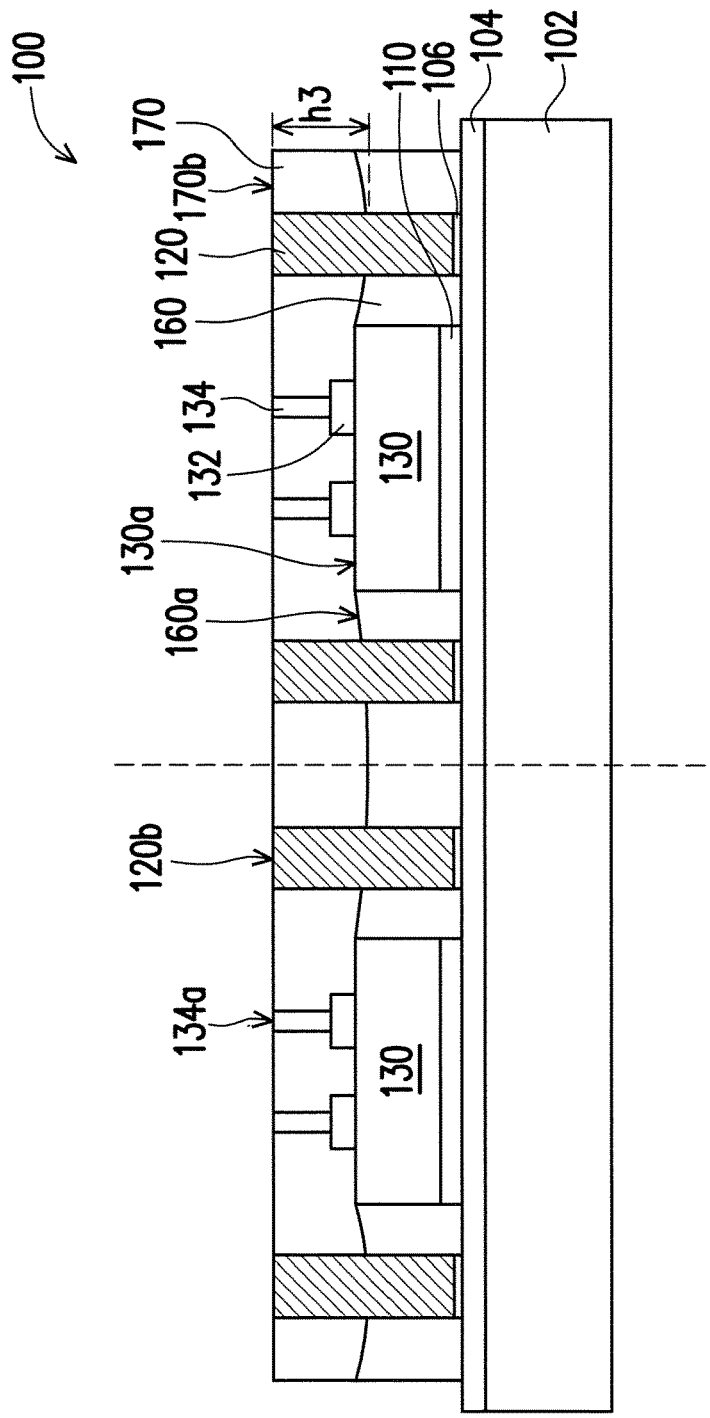

Referring to FIG. 1F, in some embodiments, a planarization process is performed on the dielectric layer 170, so that parts of the dielectric layer 170 and the TIVs 120 are removed together with the removal of the solders 136 and that the metal posts 134 of the first chips 130 are exposed from the dielectric layer 170. Alternatively, in one embodiment, parts of the metal posts 134 may be also removed. In certain embodiments, after the planarization, the dielectric layer 170 has a planar top surface 170b, and the metal posts 134, the TIVs 120 and the dielectric layer 170 become flattened and substantially levelled (i.e., top surfaces 134a of the metal posts 134 and top surfaces 120b of the TIVs 120 are substantially coplanar and flush with the polished top surface 170b of the dielectric layer 170). In some embodiments, the planarization process for planarizing the dielectric layer 170 and the TIVs 120 includes a fly cut process, a grinding process or a chemical mechanical polishing ("CMP") process. In some embodiments, the thickness (or height h3) of the planar dielectric layer 170 (measuring from the top surface 160a of the molding compound 160 to the planar top surface 170b of the dielectric layer 170) ranges from about 5 microns to about 10 microns, for example. The metal posts 134 and the TIVs 120 are exposed from the top surface 170b of the planar dielectric layer 170 for further connection. The planar dielectric layer 170 and the molding compound 160 constitute a composite molding compound.

Figure 1G:
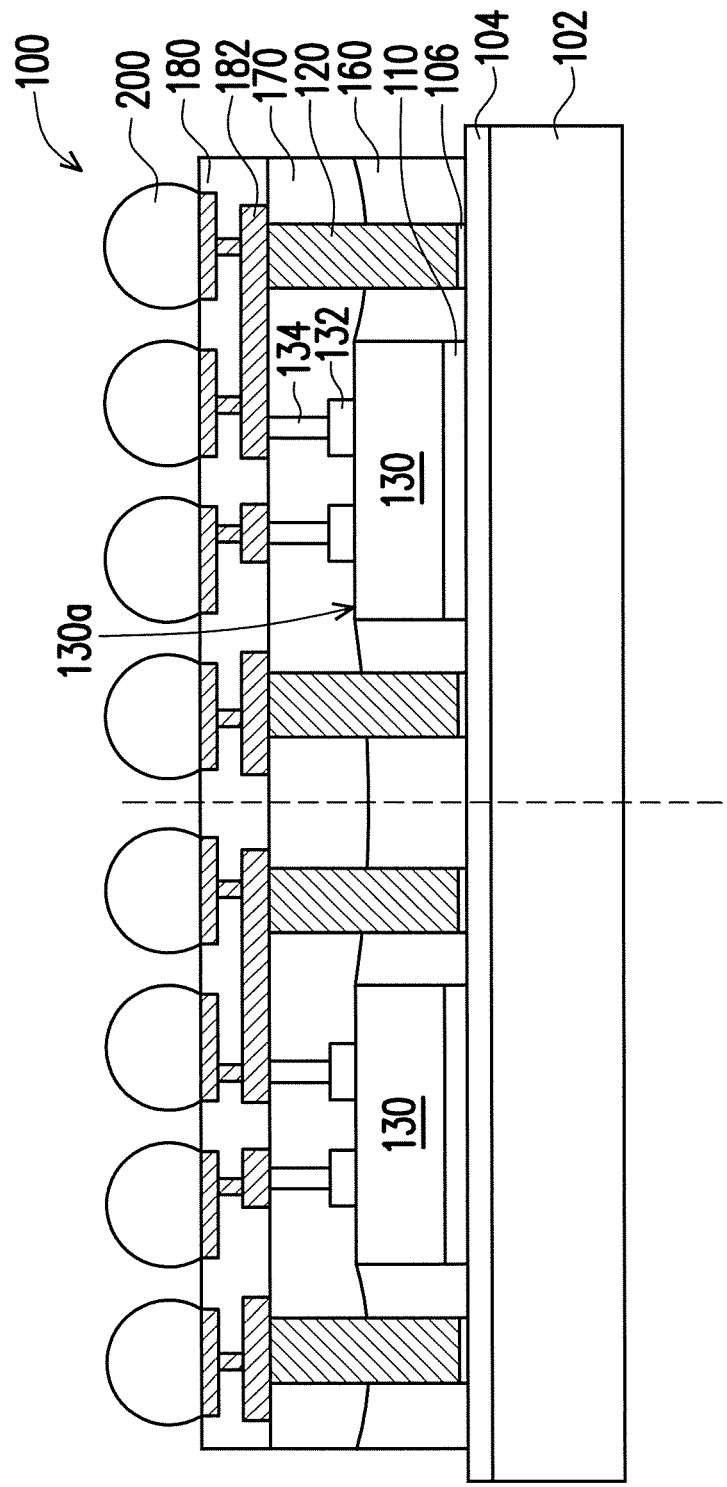

Referring to FIG. 1G, in some embodiments, a redistribution layer 180 is formed on the dielectric layer 170, over the metal posts 134 of the first chips 130 and on the TIVs 120. In some embodiment, the redistribution layer 180 is electrically connected to the TIVs 120 and the metal posts 134 of the first chips 130. The formation of the redistribution layer 180 includes sequentially forming one or more dielectric layers and one or more metallization layers in alternation. In certain embodiments, the metallization layer(s) may be sandwiched between the dielectric layer(s), but at least the bottom metallization layer 182 of the redistribution layer 180 is physically connected to the metal posts 134 of the first chips 130 and the TIVs 120. In some embodiments, the material of the metallization layer(s) includes aluminum, titanium, copper, nickel, tungsten, silver and/or alloys thereof. In some embodiments, the material of the dielectric layer(s) includes polyimide, benzocyclobutene, or polybenzooxazole. In some embodiments, the redistribution layer 180 is a front-side redistribution layer electrically connected to the first chips 130 and is electrically connected to the TIVs 120. In certain embodiments, as the composite structure of molding compound 160 and the dielectric layer 170 provides better planarization and evenness, the later-formed redistribution layer 180, especially the metallization layer with thin line width or tight spacing, can be formed with uniform line-widths or even profiles over the flat and level dielectric layer 170, resulting in improved line/wiring reliability.

Referring to FIG. 1G, in some embodiments, the conductive elements 200 are disposed on the redistribution layer 180 and are electrically connected to the redistribution layer 180. In some embodiments, prior to disposing the conductive elements 200, flux may be applied so that the conductive elements 200 are better fixed to a top metallization layer (not shown) of the redistribution layer, and the top metallization layer may function as contact pads for the conductive elements 200. In some embodiments, the conductive elements 200 are, for example, solder balls or ball grid array ("BGA") balls placed on the redistribution layer 180 and the top metallization layer underlying the conductive elements 200 functions as ball pads. In some embodiments, some of the conductive elements 200 are electrically connected to the first chips 130 through the redistribution layer 180, and some of the conductive elements 200 are electrically connected to the TIVs 120.

Figure 1H:
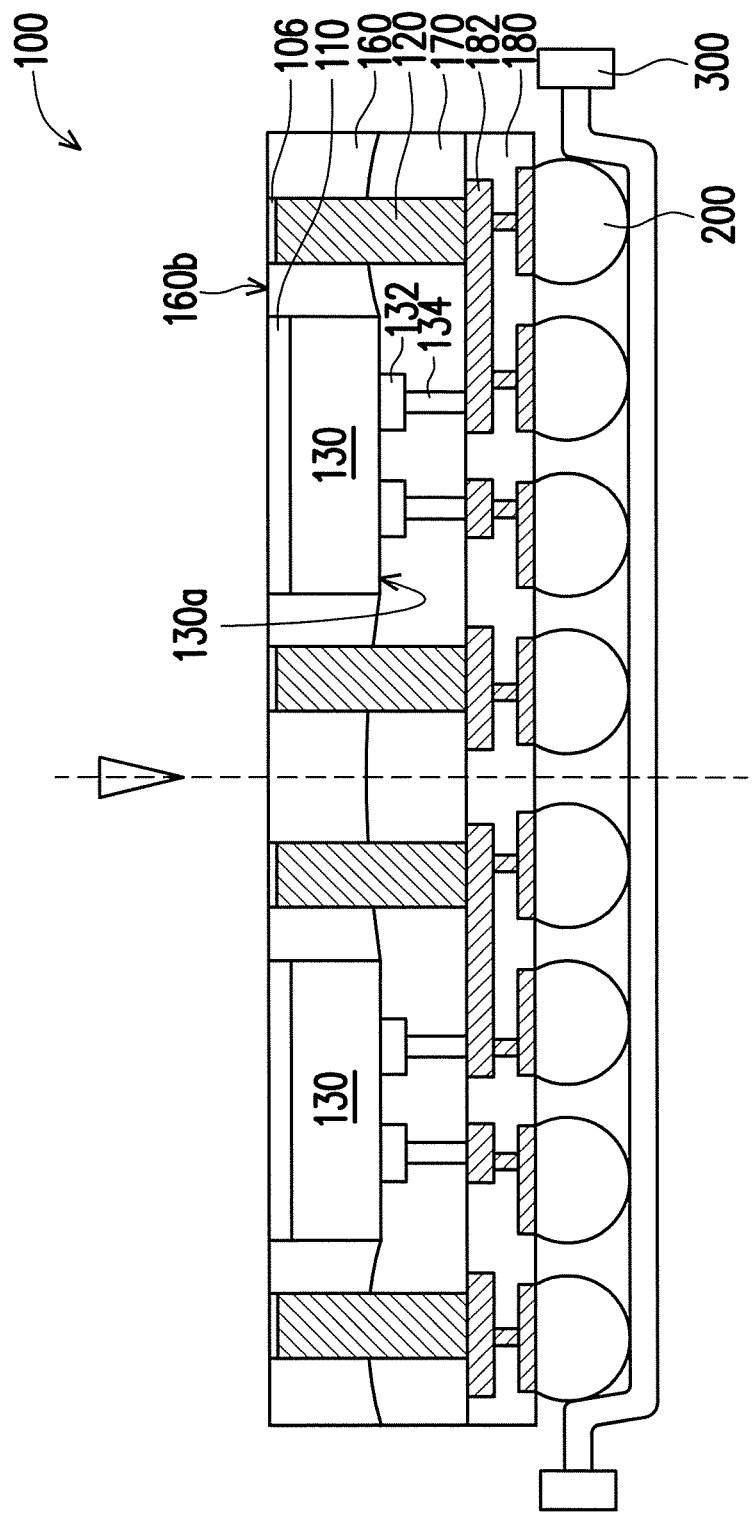

Referring to FIGS. 1G and 1H, in some embodiments, the whole package 100 is debonded from the carrier 102. In some embodiments, after debonding from the carrier 102, the buffer layer 104 remained on the whole package 100 is removed through an etching process or a cleaning process. Optionally, in later processes, another redistribution layer (not shown) will be formed at the backside of the first chip 130 and over a bottom surface 160b of the molding compound 160. Alternatively, in one embodiment, the buffer layer 104 may be remained.

Figure 1I:
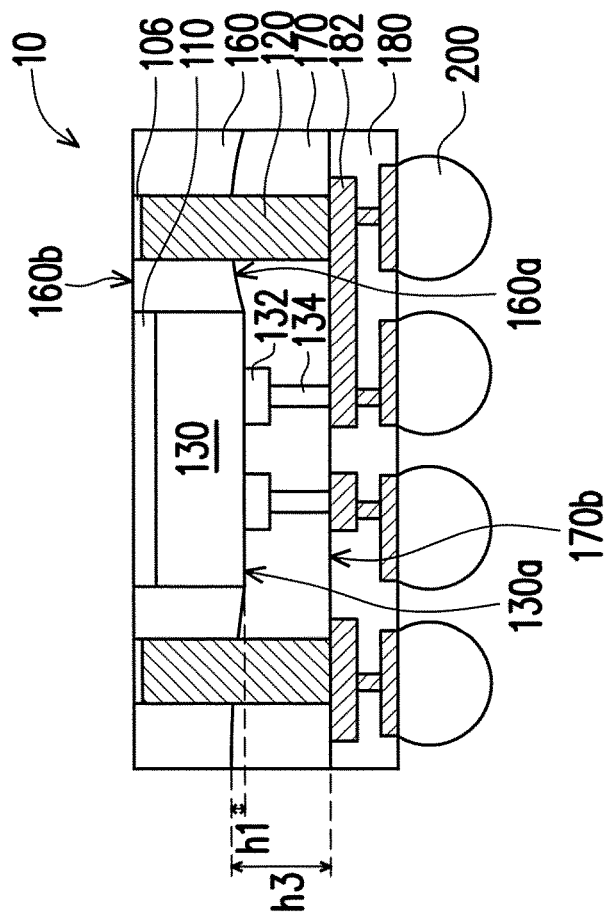

Referring to FIG. 1H, in some embodiments, the whole package 100 is turned upside down and disposed on a carrier film 300. Subsequently, in certain embodiments, a dicing process is performed to cut the whole package structure (at least cutting though the molding compound 160, the dielectric layer 170, and the redistribution layer 180) along the cutting line (the dotted line) into individual and separated semiconductor packages 10, as shown in FIG. 1I. In one embodiment, the dicing process is a wafer dicing process including mechanical blade sawing or laser cutting.

Referring to FIG. 1I, as the package structure is turned upside down, the top surfaces may become the bottom surfaces and the relative positional relationships (such as above, below, higher or lower) may become the opposite for the package structures as described above, but the same surfaces, common surfaces or interfaces will be marked with the same reference numbers for the individual semiconductor package(s) 10. For example, as shown in FIG. 1G, in a direction of sequentially stacking the molding compound 160, the dielectric layer 170 and the redistribution layer 180, the surface 160a of the molding compound 160 is substantially lower than the active surface 130a of the first chip 130. However, as shown in FIG. 1I, in a direction of sequentially stacking the redistribution layer 180, the dielectric layer 170 and the molding compound 160, the surface 160a of the molding compound 160 is substantially higher than the active surface 130a of the first chip 130. In some embodiments, the semiconductor package 10 includes the first chip 130, the TIVs 120, the molding compound 160, and the dielectric layer 170. The first chip 130 has the connectors such as the pads 132 and the metal posts 134 thereon. The TIVs 120 are disposed aside the first chip 130. The molding compound 160 at least encapsulates the first chip 130 and the TIVs 120, wherein the surface 160a of the molding compound 160 is substantially lower than the active surface 130a of the first chip 130 and the surfaces 120b of the TIVs 120. The dielectric layer 170 is disposed over the first chip 130 and the molding compound 160, wherein the surface 170b of the dielectric layer 170 is coplanar with the surfaces 120b of the TIVs 120. The material of the dielectric layer 170 is different from the material of the molding compound 160.

In exemplary embodiments, the manufacturing method(s) described above is part of the packaging processes, and a plurality of semiconductor packages 10 is obtained after the wafer dicing process. During the packaging processes, the semiconductor package structure 10 may be further mounted with additional packages, chips/dies or other electronic devices.

Figure 2:
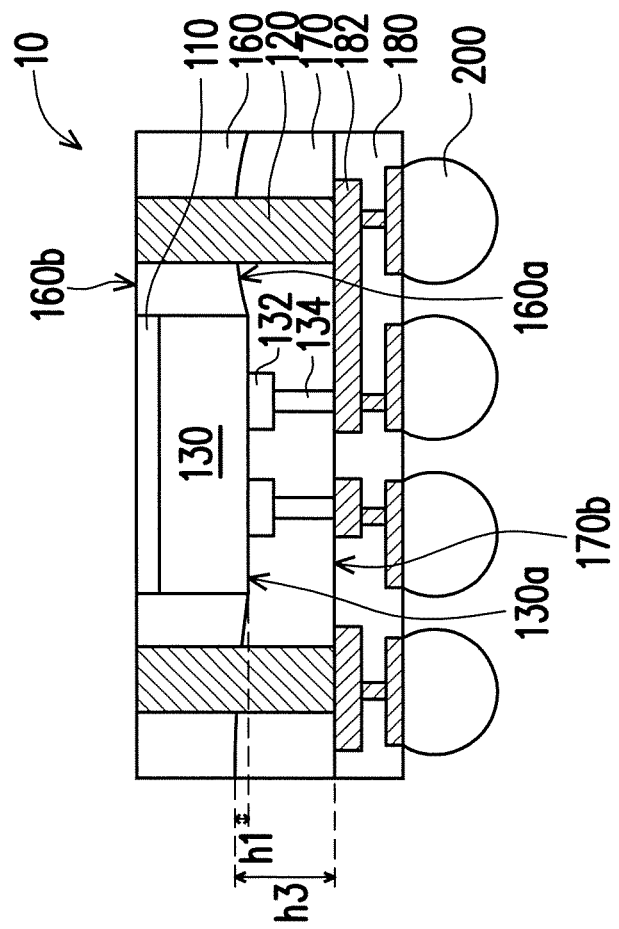
FIG. 2 is a schematic cross sectional view illustrating a semiconductor packages according to some exemplary embodiments of the present disclosure.

FIG. 2 is a schematic cross sectional view illustrating a semiconductor package according to some exemplary embodiments. In FIG. 2, a semiconductor package 10 similar to the structure as shown in FIG. 1I is described, except the seed layer is omitted.

FIG. 3A to FIG. 3H are schematic cross sectional views of various stages in a manufacturing method of a semiconductor package according to some exemplary embodiments of the present disclosure. The difference between the method of FIG. 3A to FIG. 3H and the method of FIG. 1A to FIG. 1I lies in the structure of the connector. The difference is illustrated in details below, and the similarity is not iterated herein.

Figure 3A:
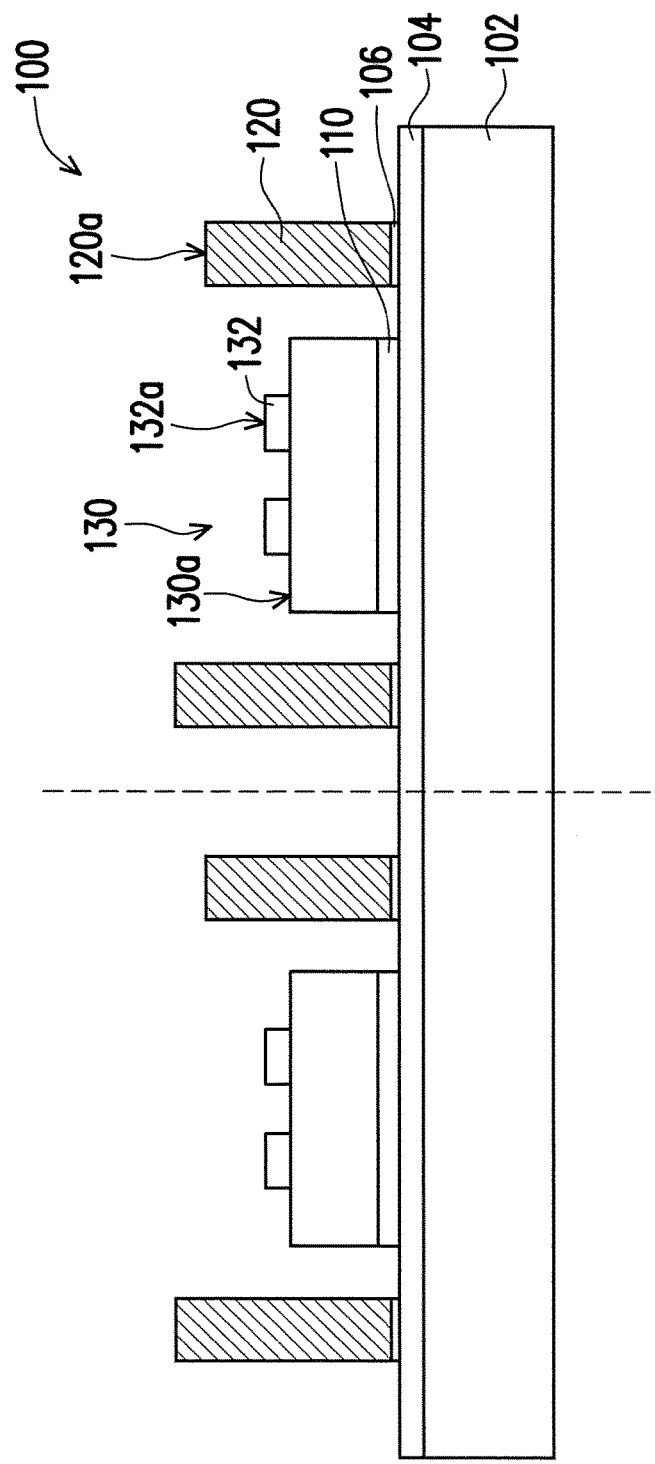
FIG. 3A to FIG. 3H are schematic cross sectional views of various stages in a manufacturing method of a semiconductor package according to some exemplary embodiments of the present disclosure.

Referring to FIG. 3A, TIVs 120 are formed on a buffer layer 104 over a carrier 102. Then, first chips 130 are provided and disposed on the buffer layer 104 over the carrier 102, and the TIVs 120 are disposed aside the first chips 130. In some embodiments, the first chip 130 includes pads 132 on an active surface 130*a*, and top surfaces 132*a* of the pads 132 are lower than top surfaces 120*a* of TIVs 120. In exemplary embodiments, the pads 132 are aluminum contact pads.

Figure 3B:
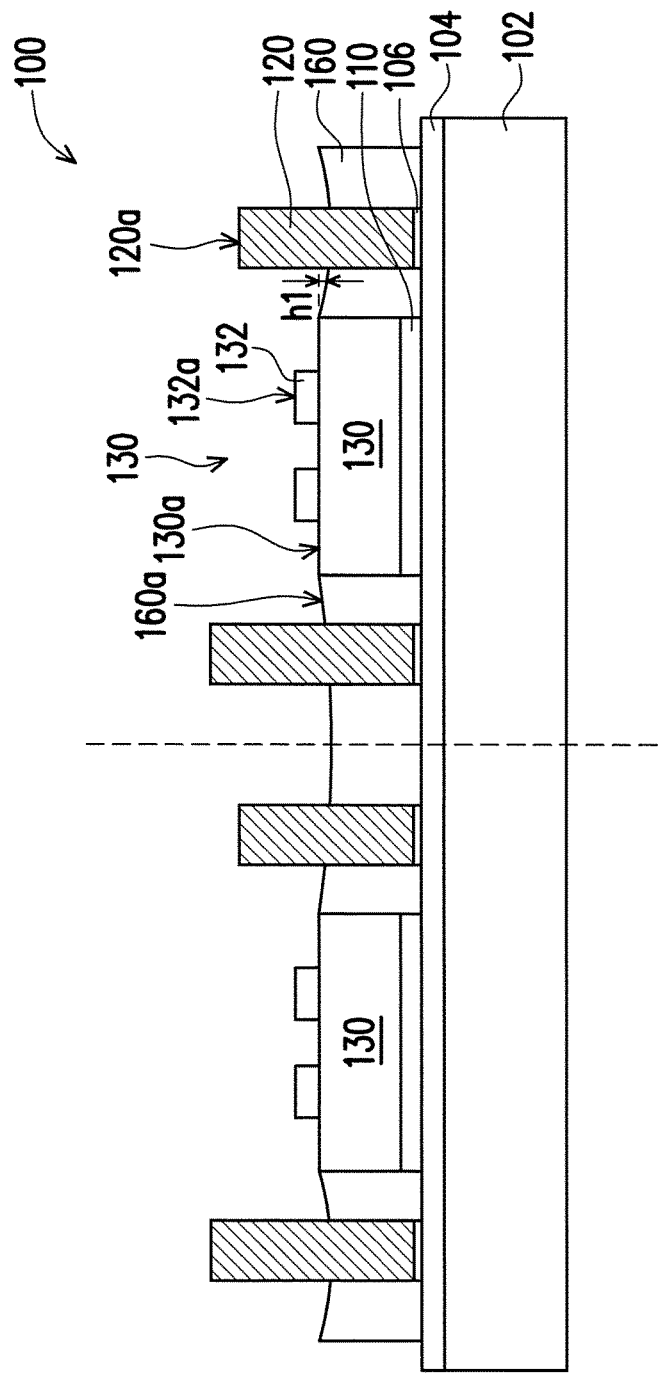

Referring to FIG. 3B, a molding compound 160 is formed over the carrier 102, and the first chips 130 on the buffer layer 104 and a portion of the TIVs 120 located over the carrier 102 aside the first chips 130 are encapsulated in the molding compound 160. In some embodiments, the molding compound 160 covers the buffer layer 104 and fills between the first chips 130 and the TIVs 120, and a top surface 160*a* of the molding compound 160 is substantially lower than the active surfaces 130*a* of the first chips 130. That is, the top surface 160*a* of the molding compound 160 is lower than the top surfaces 132*a* of the pads 132, and the top surfaces 132*a* of the pads 132 are exposed.

Figure 3C:
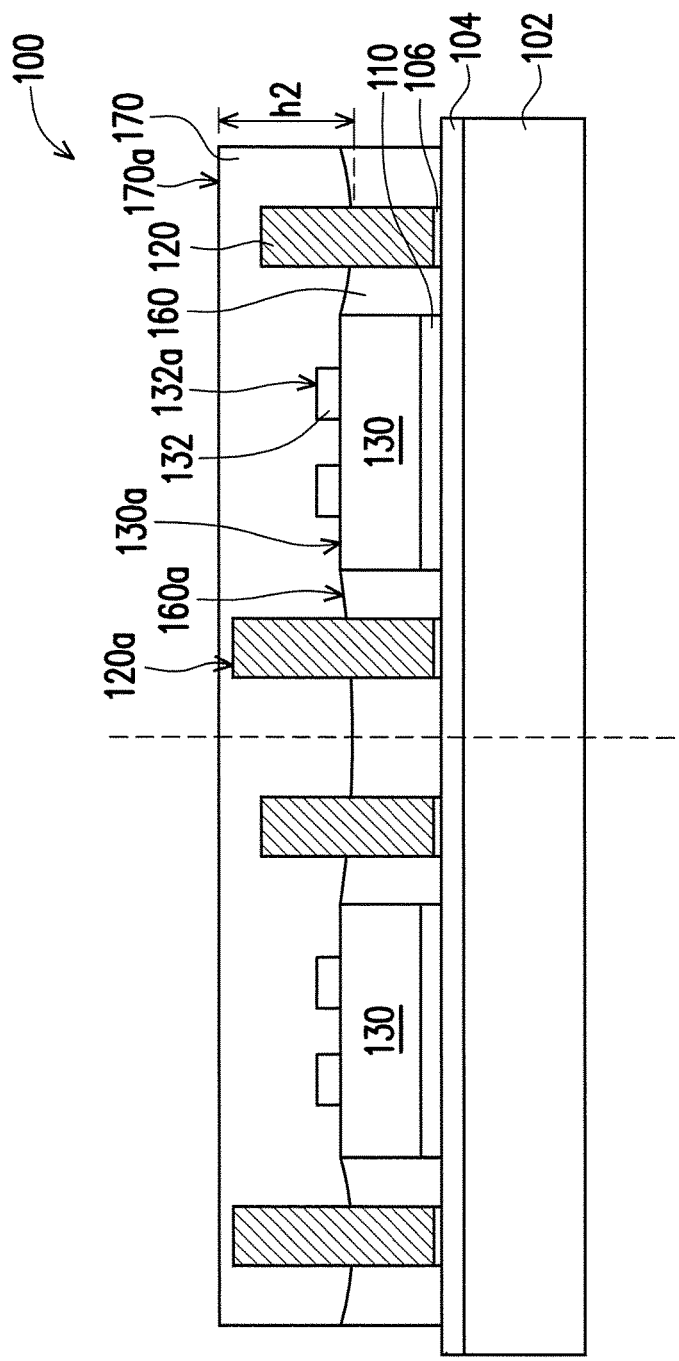

Referring to FIG. 3C, in some embodiments, a dielectric layer 170 is formed on the molding compound 160. As shown in FIG. 3C, the dielectric layer 170 is formed over the molding compound 160, the active surfaces 130*a* of the first chips 130 and the top portions of the TIVs 120. Thus, the pads 132 of the first chips 130 and the top portions of the TIVs 120 are encapsulated by the dielectric layer 170. That is, a top surface of the dielectric layer 170 is higher than the top surfaces 120*a* of TIVs 120 and top surfaces 132*a* of the pads 132.

Figure 3D:
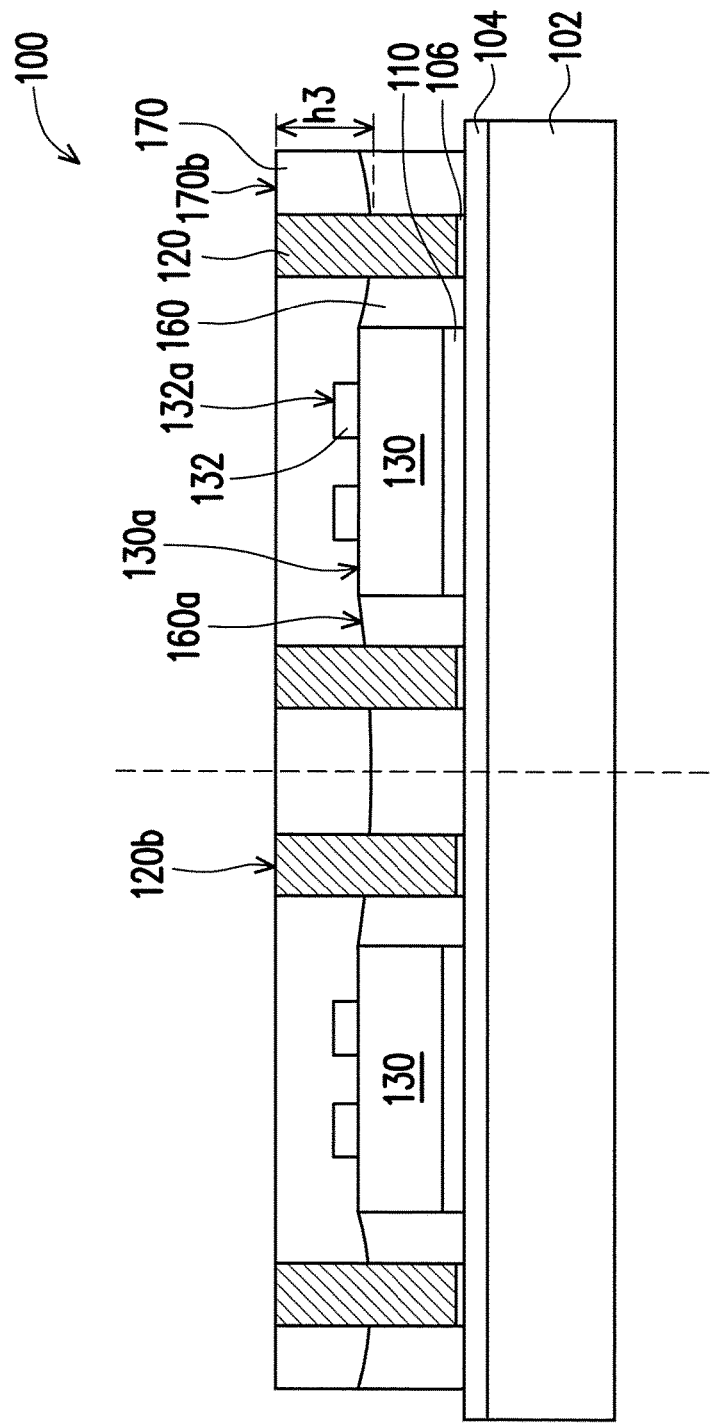

Referring to FIG. 3D, in some embodiments, a planarization process is performed on the dielectric layer 170, so that parts of the dielectric layer 170 and the TIVs 120 are removed. After the planarization process, the top surfaces 132*a* of the pads 132 are covered by the dielectric layer 170, and the TIVs 120 and the dielectric layer 170 become flattened and substantially levelled (i.e. top surfaces 120*b* of the TIVs 120 are substantially coplanar and flush with the polished top surface 170*b* of the dielectric layer 170).

Figure 3E:
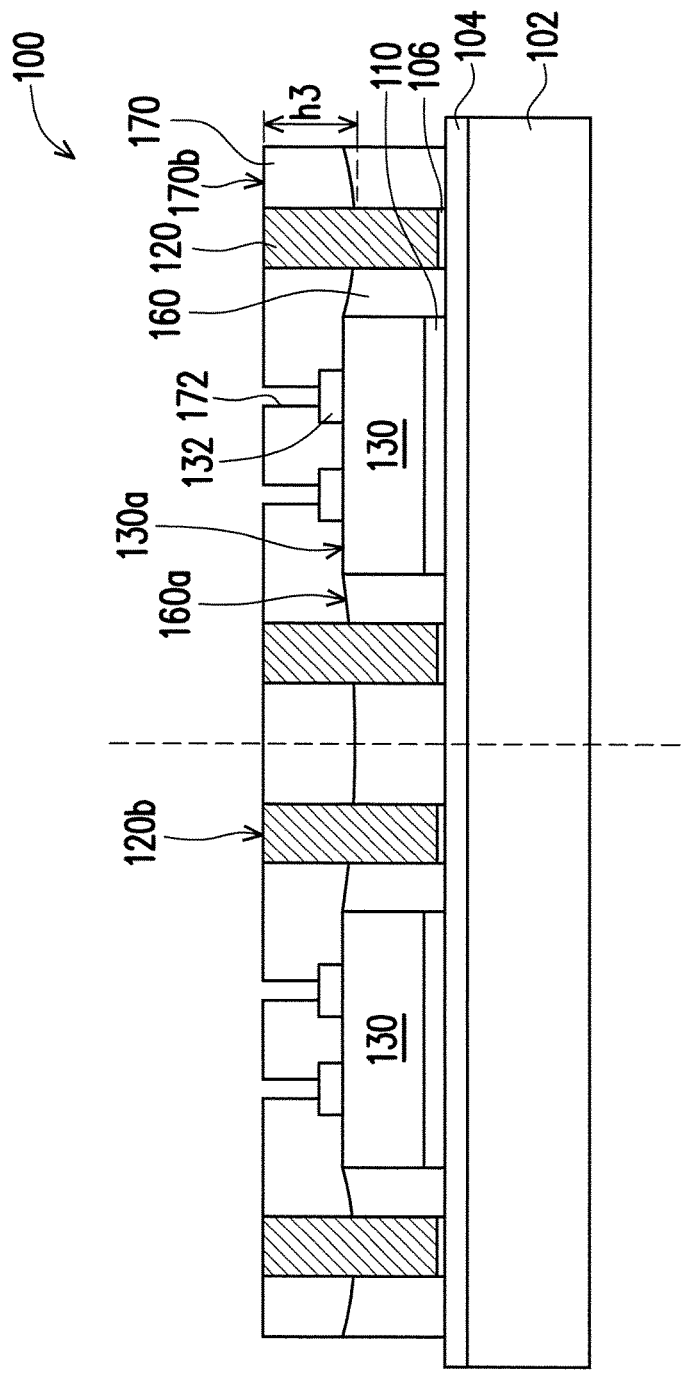

Referring to FIG. 3E, in some embodiments, openings 172 are formed in the dielectric layer 170 to expose a portion of the pads 132 of the first chips 130. In some embodiments, the formation of the openings 172 includes forming a mask pattern (not shown) with openings on the dielectric layer 170 partially exposing the dielectric layer 170, then removing a portion of the dielectric layer 170 exposed by the mask pattern, and removing the mask pattern to form the openings 172 in the dielectric layer 170.

Figure 3F:
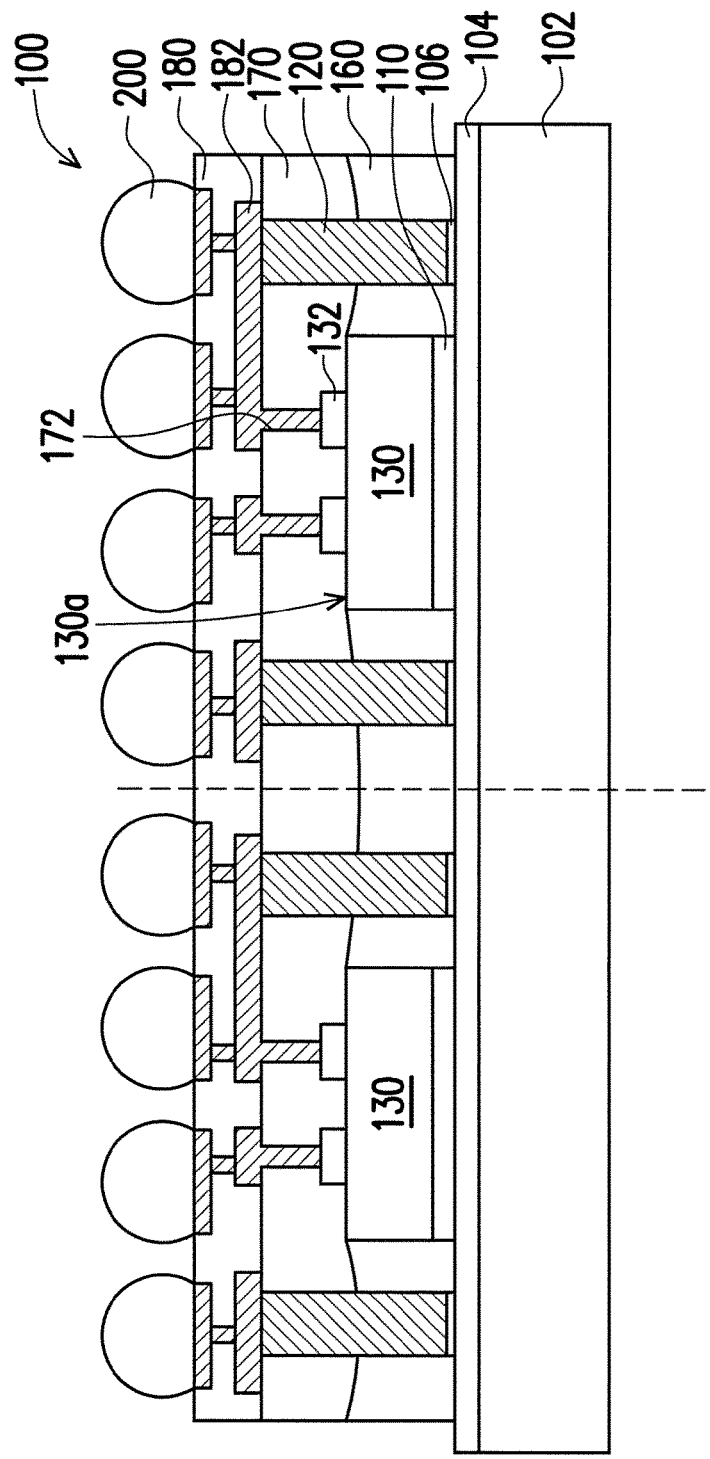

Referring to FIG. 3F, in some embodiments, a redistribution layer 180 is formed on the dielectric layer 170, over the pads 132 of the first chips 130 and on the TIVs 120. In some embodiment, the redistribution layer 180 is electrically connected to the TIVs 120 and the pads 132 of the first chips 130. In certain embodiments, the metallization layer(s) may be sandwiched between the dielectric layer(s), but at least the bottom metallization layer 182 of the redistribution layer 180 is physically connected to the pads 132 of the first chips 130 and the TIVs 120. In some embodiments, a portion of the bottom metallization layer 182 is formed in the openings 172 to electrically connect to the pads 132.

Referring to FIG. 3F, in some embodiments, the conductive elements 200 are disposed on the redistribution layer 180 and are electrically connected to the redistribution layer 180.

Figure 3G:
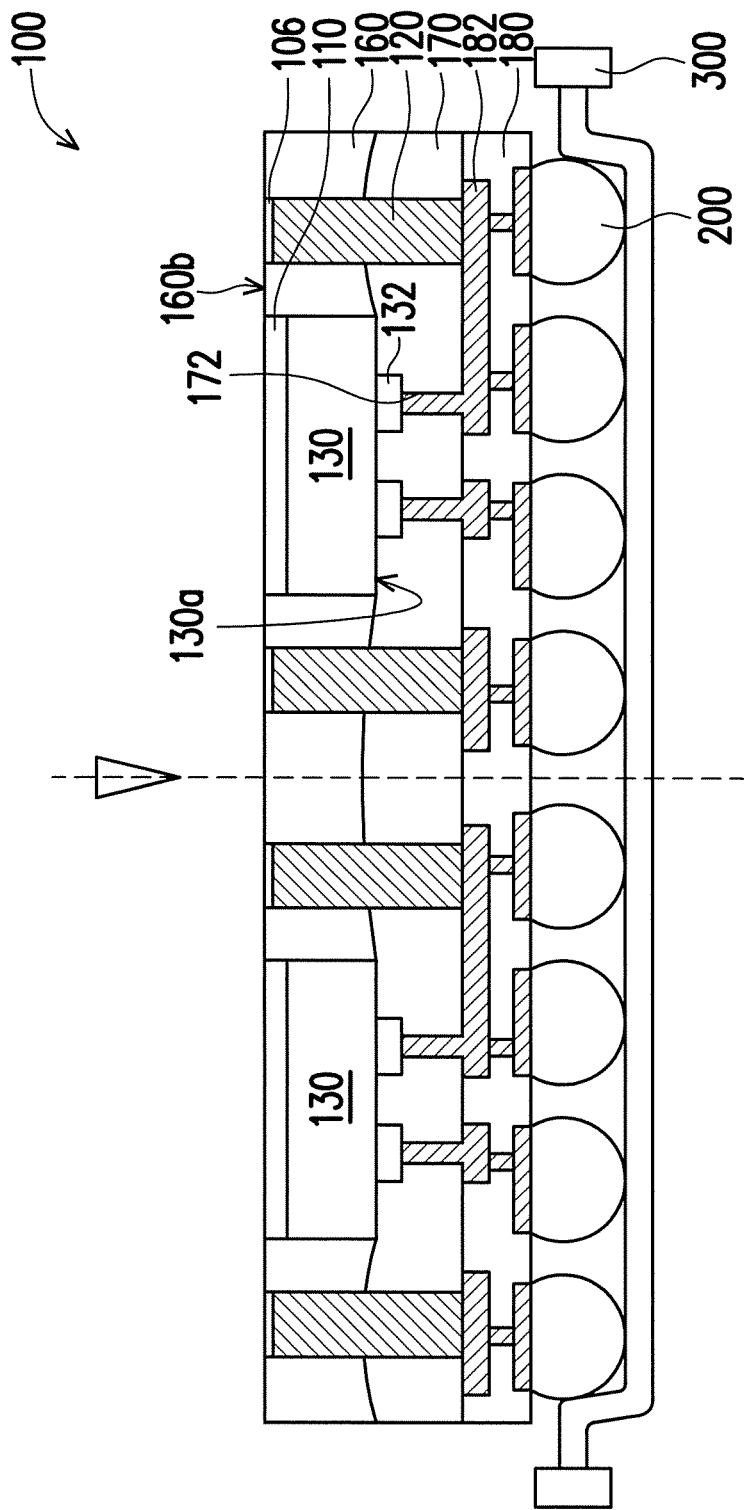

Referring to FIGS. 3F and 3G, in some embodiments, the whole package 100 is debonded from the carrier 102 to separate the first chips 130 from the carrier 102. Referring to FIG. 3G, in some embodiments, the whole package 100 is turned upside down and disposed on a carrier film 300. Subsequently, in certain embodiments, a dicing process is performed to cut the whole package structure along the cutting line (the dotted line) into individual and separated semiconductor packages 10, as shown in FIG. 3H.

Figure 3H:
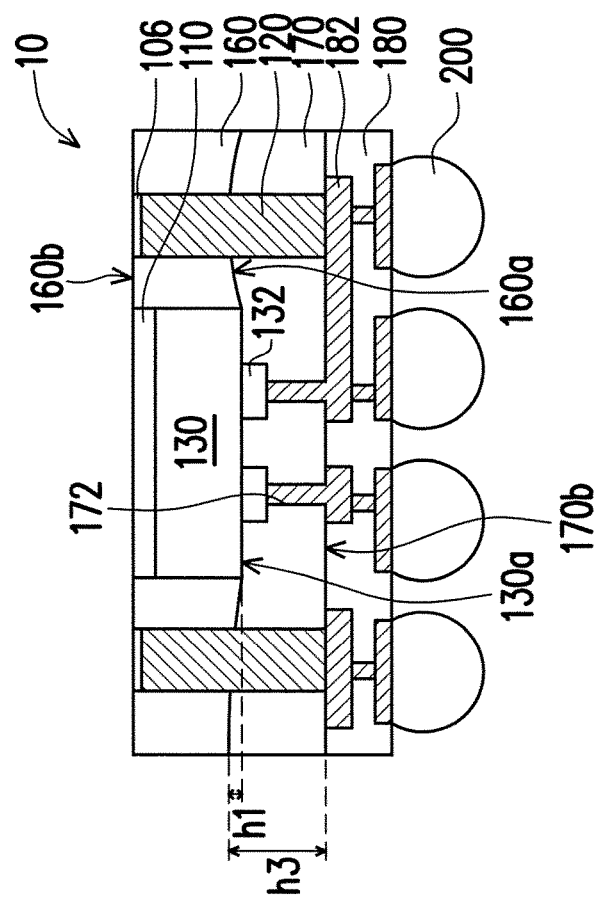

Referring to FIG. 3H, as the package structure is turned upside down, the top surfaces may become the bottom surfaces and the relative positional relationships (such as above, below, higher or lower) may become the opposite for the package structures as described above, but the same surfaces, common surfaces or interfaces will be marked with the same reference numbers for the individual semiconductor package(s) 10.

Figure 4:
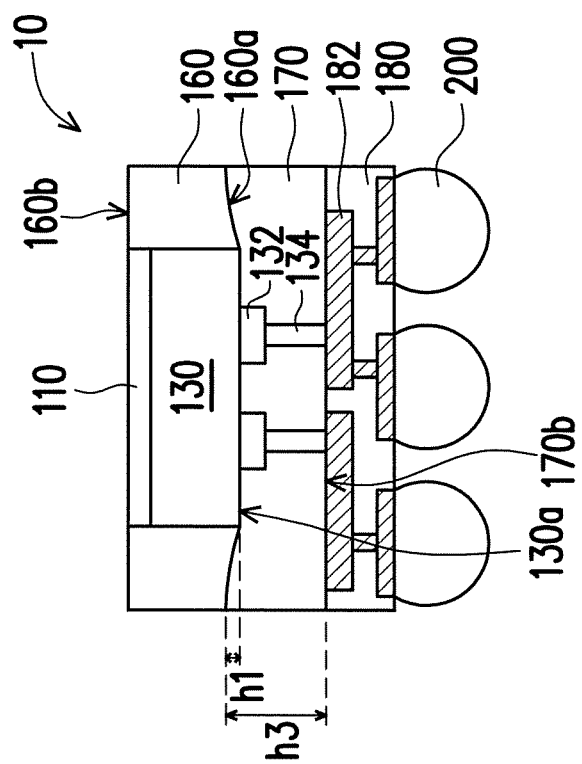
FIG. 4 is a schematic cross sectional view illustrating a semiconductor packages according to some exemplary embodiments of the present disclosure.

FIG. 4 is a schematic cross sectional view illustrating a semiconductor package according to some exemplary embodiments. In FIG. 4, a semiconductor package 10 similar to the structure as shown in FIG. 1I is described, except the TIVs are omitted. In addition, the difference between a manufacturing method of a semiconductor package of FIG. 4 and the manufacturing method of a semiconductor package of FIG. 1I (as shown in FIG. 1A to FIG. 1I) lies in the formation of TIVs is omitted. In the semiconductor package 10, the top surface 160*a* of the molding compound 160 is lower than the active surfaces 130*a* of the first chips 130, and the dielectric layer 170 is disposed over the molding compound 160 to encapsulate the metal posts 134 of the first chips 130. In addition, the top surfaces 134*a* of the metal posts 134 are substantially coplanar and flush with the polished top surface 170*b* of the dielectric layer 170.

Figure 5:
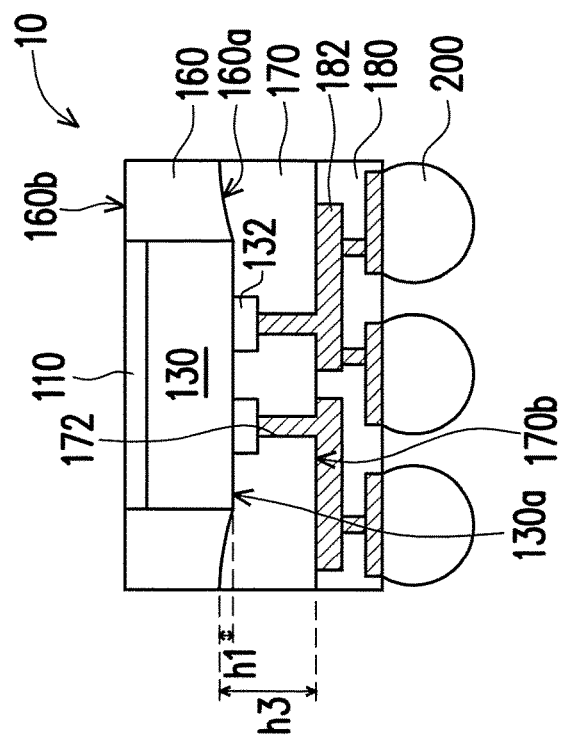
FIG. 5 is a schematic cross sectional view illustrating a semiconductor packages according to some exemplary embodiments of the present disclosure.

FIG. 5 is a schematic cross sectional view illustrating a semiconductor package according to some exemplary embodiments. In FIG. 5, a semiconductor package 10 similar to the structure shown in FIG. 3H is described, except the TIVs are omitted. In addition, the difference between a manufacturing method of a semiconductor package of FIG. 5 and the manufacturing method of a semiconductor package of FIG. 3H (as shown in FIG. 3A to FIG. 3H) lies in omission of the formation of TIVs. In the semiconductor package 10, the top surface 160*a* of the molding compound 160 is lower than the active surfaces 130*a* of the first chips 130, and the dielectric layer 170 is disposed over the molding compound 160 to encapsulate the pads 132 of the first chips 130. In addition, the dielectric layer 170 includes the openings 172 to expose parts of the pads 132 of the first chips 130.

Figure 6:
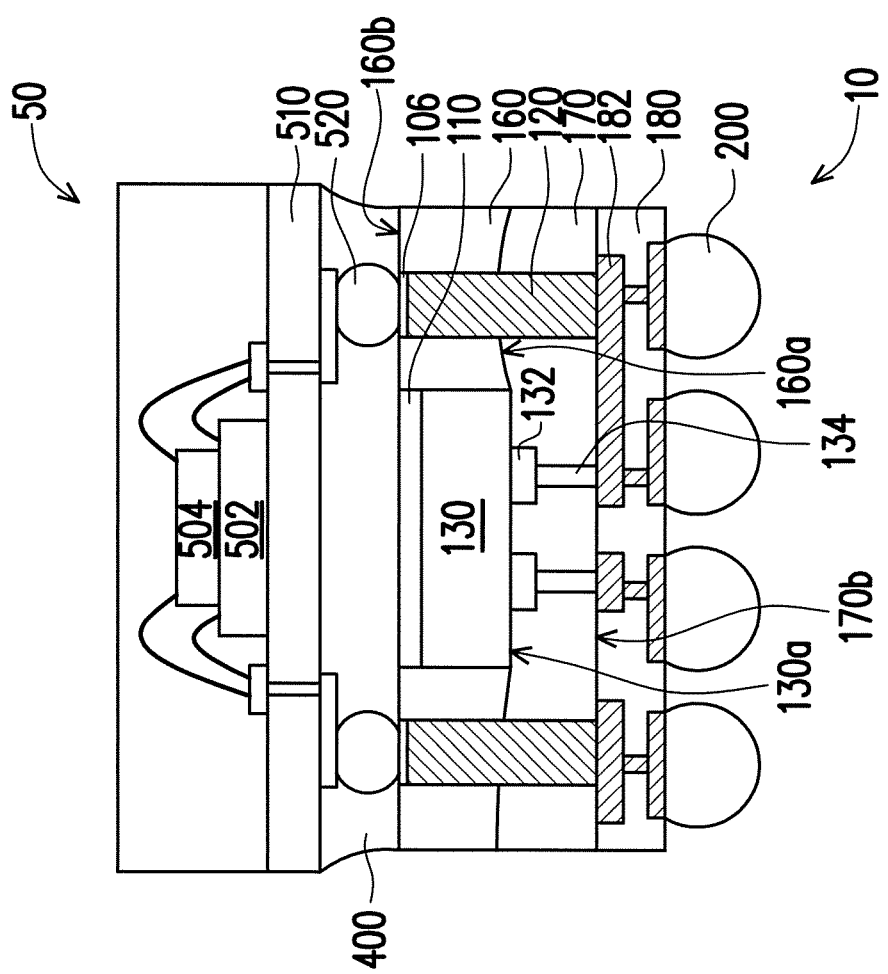
FIG. 6 is a schematic cross sectional view illustrating a semiconductor packages according to some exemplary embodiments of the present disclosure.

In FIG. 6, in exemplary embodiments, a semiconductor package 10 is provided, and the semiconductor package 10 is similar to the package 10 as seen in FIG. 1I and may be fabricated following the previously described manufacturing process as described in FIG. 1A-1I. The elements similar to or substantially the same as the elements described above will use the same reference numbers, and certain details or descriptions of the same elements will not be repeated herein. Referring to FIG. 6, in some embodiments, at least one semiconductor sub-package 50 is provided and disposed on the semiconductor package 10. In exemplary embodiments, the sub-package 50 includes a second chip 502, a third chip 504 stacked thereon, at least one redistribution layer 510 electrically connected with the second and third chips 502, 504 and connectors 520 disposed on the redistribution layer 510. In some embodiments, the semiconductor sub-package 50 is connected with the semiconductor package 10 through the connectors 520. In some embodiments, at least one of the chips 502, 504 is electrically connected with the first chip 130 and/or the conductive elements 200 through the redistribution layer 510, connectors 520, TIVs 120 and the redistribution layer 180. In some embodiments, an underfill material 400 is filled between the semiconductor sub-packages 50 and the semiconductor package 10.

Figure 7A:
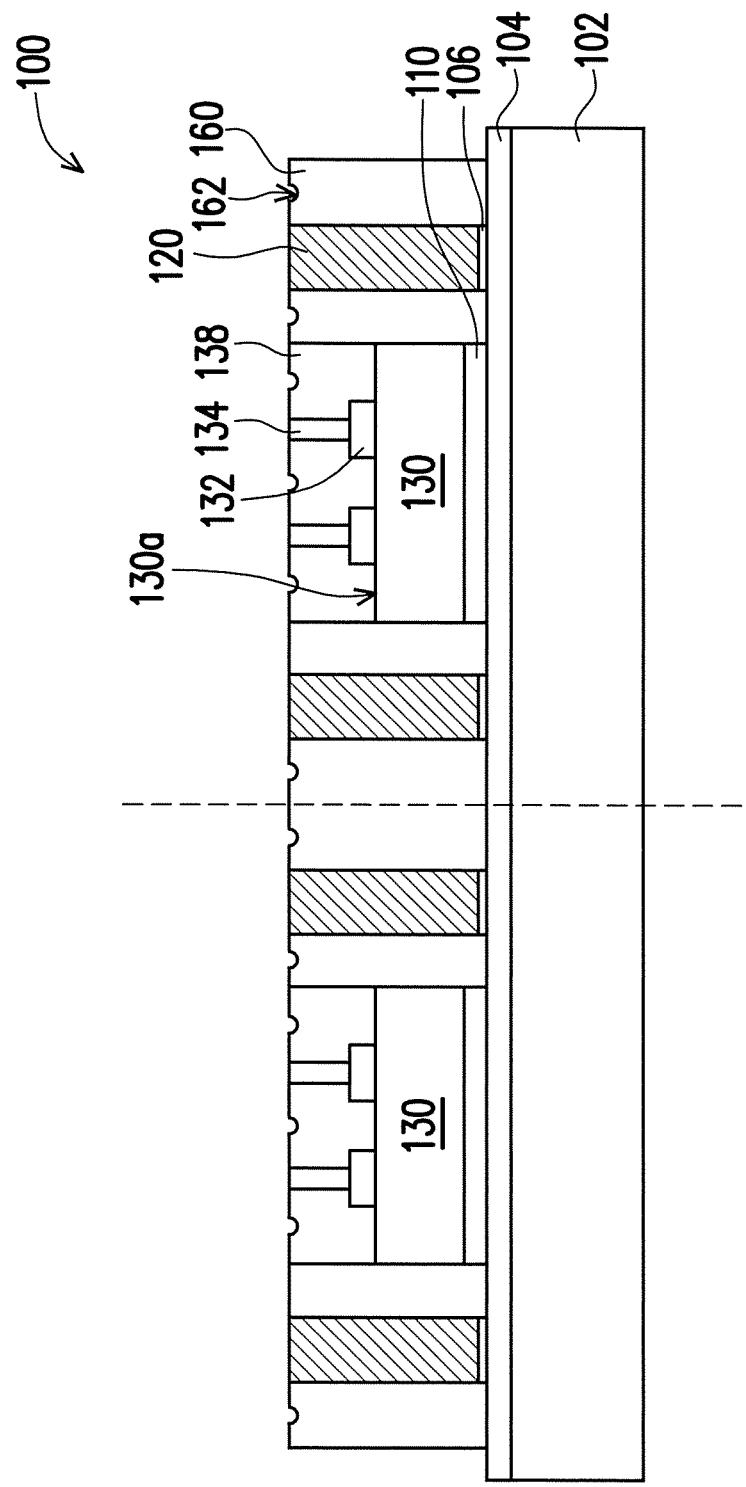
FIG. 7A to FIG. 7F are schematic cross sectional views of various stages in a manufacturing method of a semiconductor package according to some exemplary embodiments of the present disclosure.

FIG. 7A to FIG. 7F are schematic cross sectional views of various stages in a manufacturing method of a semiconductor package according to some exemplary embodiments of the present disclosure. Referring to FIG. 7A, in some embodiments, first chips 130 and TIVs 120 are formed on a carrier 102. In some embodiments, the first chip 130 includes pads 132, metal posts 134, solders (not shown) and a dielectric layer 138, the solders are disposed on the metal posts 134, and the metal posts 134 and the solders are disposed in the dielectric layer 138. A material of the dielectric layer 138 includes, for example, a polymer, and the polymer includes polybenzoxazole (PBO), polyimide (PI), benzocyclobutene (BCB), a combination thereof or the like. The TIVs 120 are disposed aside the first chip 130.

Then, a molding compound 160 is formed over the carrier 102, and the first chips 130 and the TIVs 120 beside the first chips 130 are molded in the molding compound 160. In some embodiments, the molding compound 160 covers the top surface of the dielectric layer 138 and the top surfaces of the TIVs 120.

After that, a planarization process is performed on the molding compound 160 to expose the metal posts 134 of the first chips 130 and the TIVs 120. In the planarization process, portions of the molding compound 160, the dielectric layer 138, the solders and the TIVs 120 are removed. Accordingly, the top surface of the molding compound 160 is higher than the active surfaces 130a of the first chips 130, and the top surfaces of the molding compound 160, the dielectric layer 138, the TIVs 120, and the metal post 134 become flattened and substantially levelled. In some embodiments, pits 162 may be formed in the top surface of the molding compound 160 due to removal of the fillers in the molding compound 160 by the planarization process. In some embodiments, the fillers in the molding compound 160 may be attached to a grinding wheel, and thus scratches may be formed in the top surface of the dielectric layer 138 while being grinded by the grinding wheel. Accordingly, the pits 162 may be also formed in the top surface of the dielectric layer 138. However, in alternative embodiments, the dielectric layer 138 may have a planar top surface without pits.

Figure 7B:
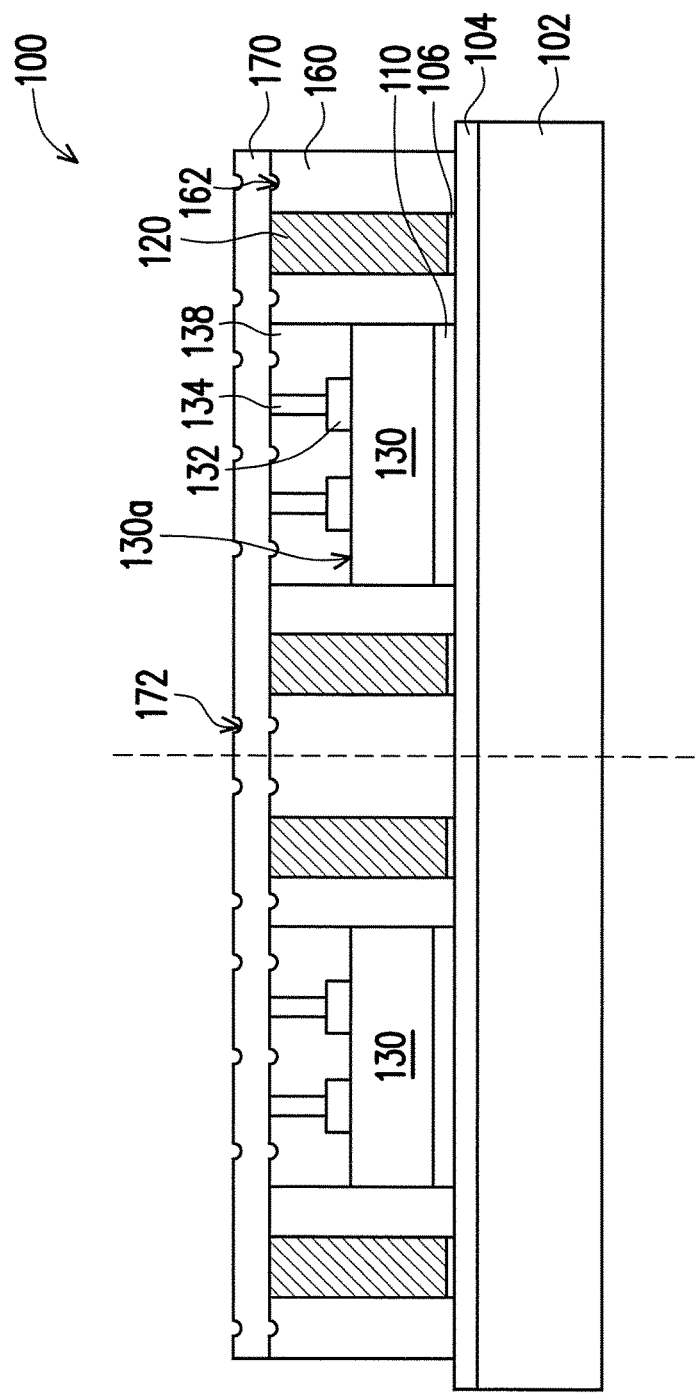

Referring to FIG. 7B, a dielectric layer 170 is formed on the molding compound 160 and the first chip 130. In some embodiments, the material of the dielectric layer 170 includes a polymeric material free of fillers and the polymeric material is selected from low-temperature curable polyimide (PI) materials, high-temperature curable polyimide (PI) materials, photosensitive or non-photosensitive dry film materials, epoxy resins, benzocyclobutene, polybenzoxazole, or any other suitable dielectric material. The dielectric layer 170 is conformally formed with the molding compound 160 and fills the pits 160 formed in the molding compound 160. In some embodiments, pits 172 are formed in the dielectric layer 170.

Figure 7C:
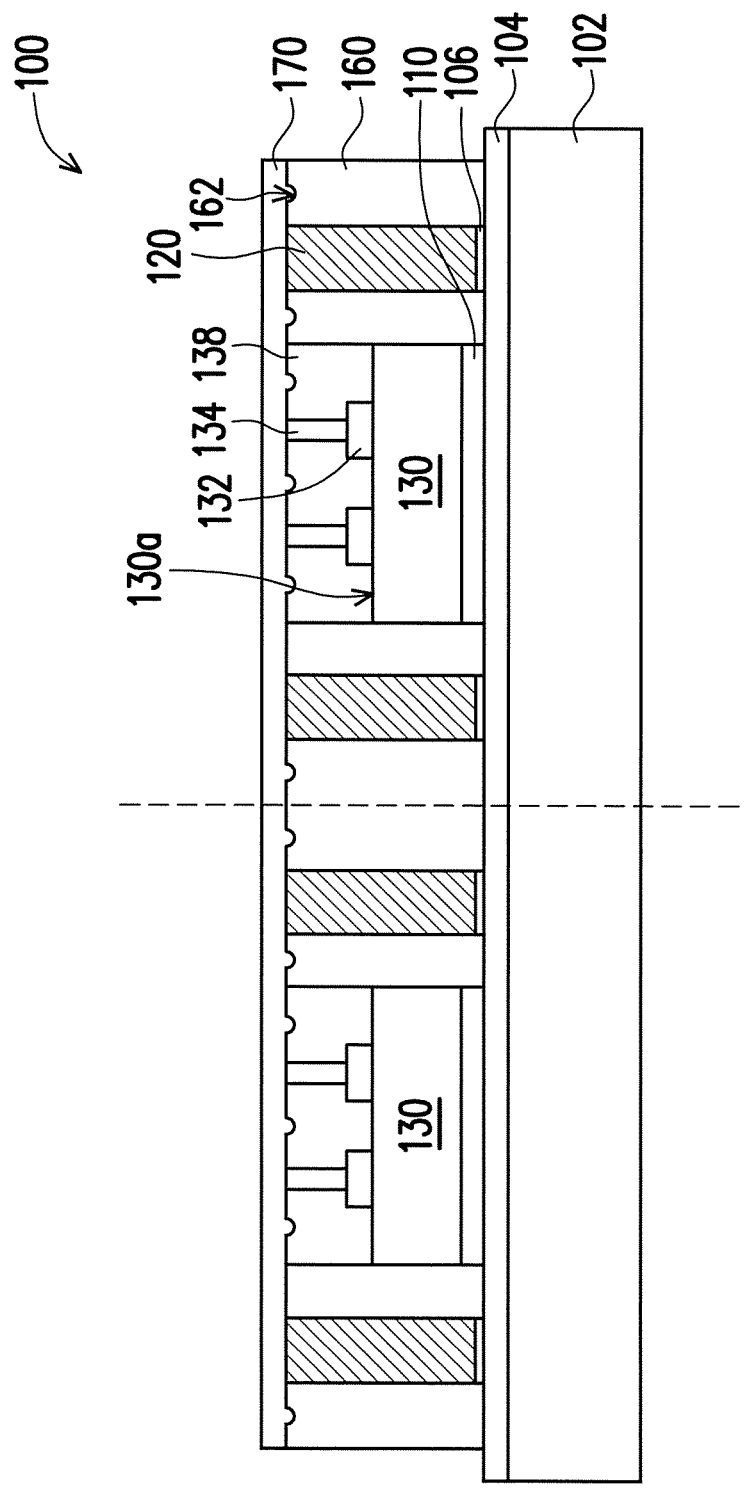

Referring to FIG. 7C, in some embodiments, a planarization process is performed on the dielectric layer 170, so that the dielectric layer 170 is partially removed. After the planarization process, the top surface of the dielectric layer 170 is flatten.

Figure 7D:
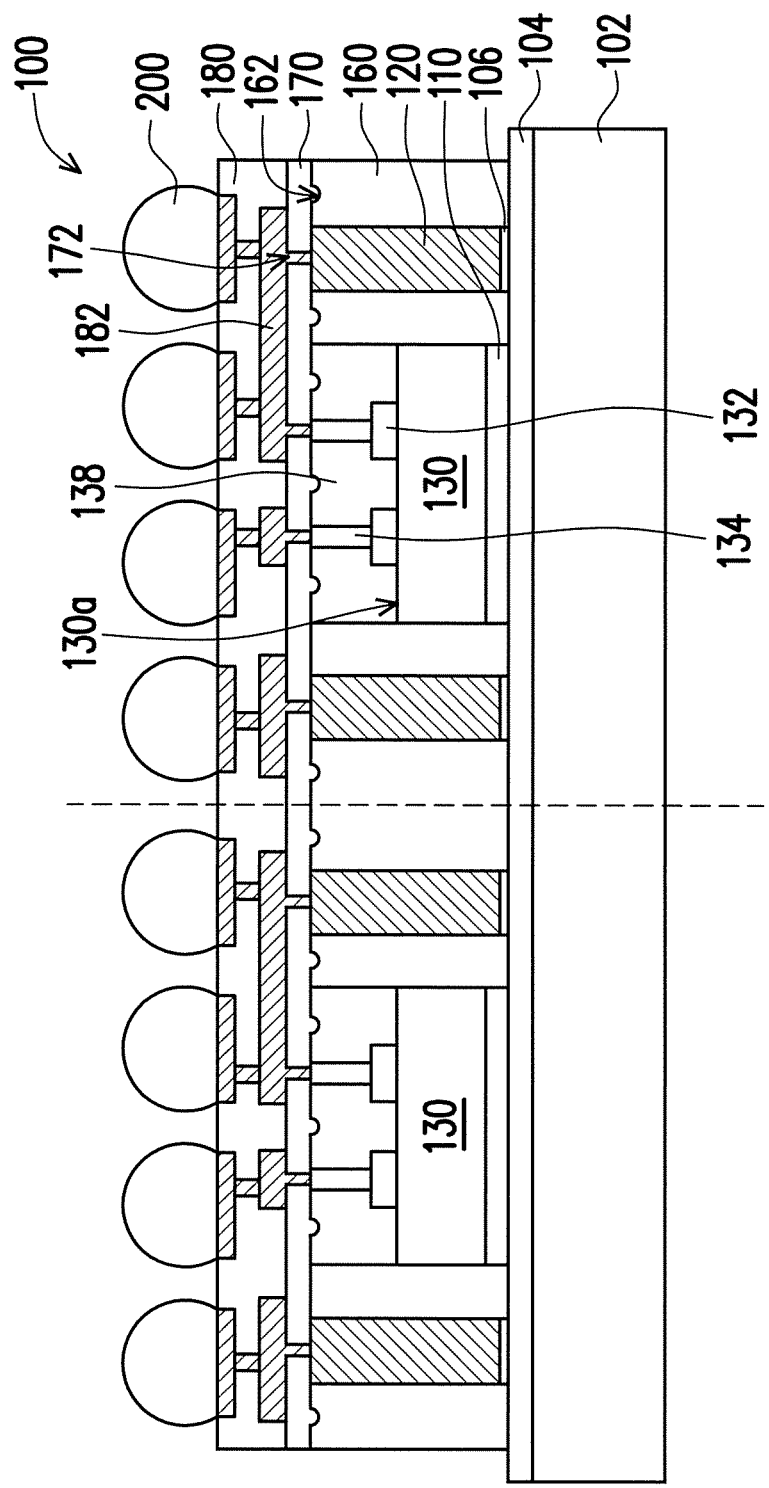

Referring to FIG. 7D, in some embodiments, openings 172 are formed in the dielectric layer 170 to expose a portion of the metal posts 134 of the first chips 130 and a portion of the TIVs 120. Then, a redistribution layer 180 is formed on the dielectric layer 170, over the metal post 134 of the first chips 130 and on the TIVs 120. After that, the conductive elements 200 are disposed on the redistribution layer 180 and are electrically connected to the redistribution layer 180.

Figure 7E:
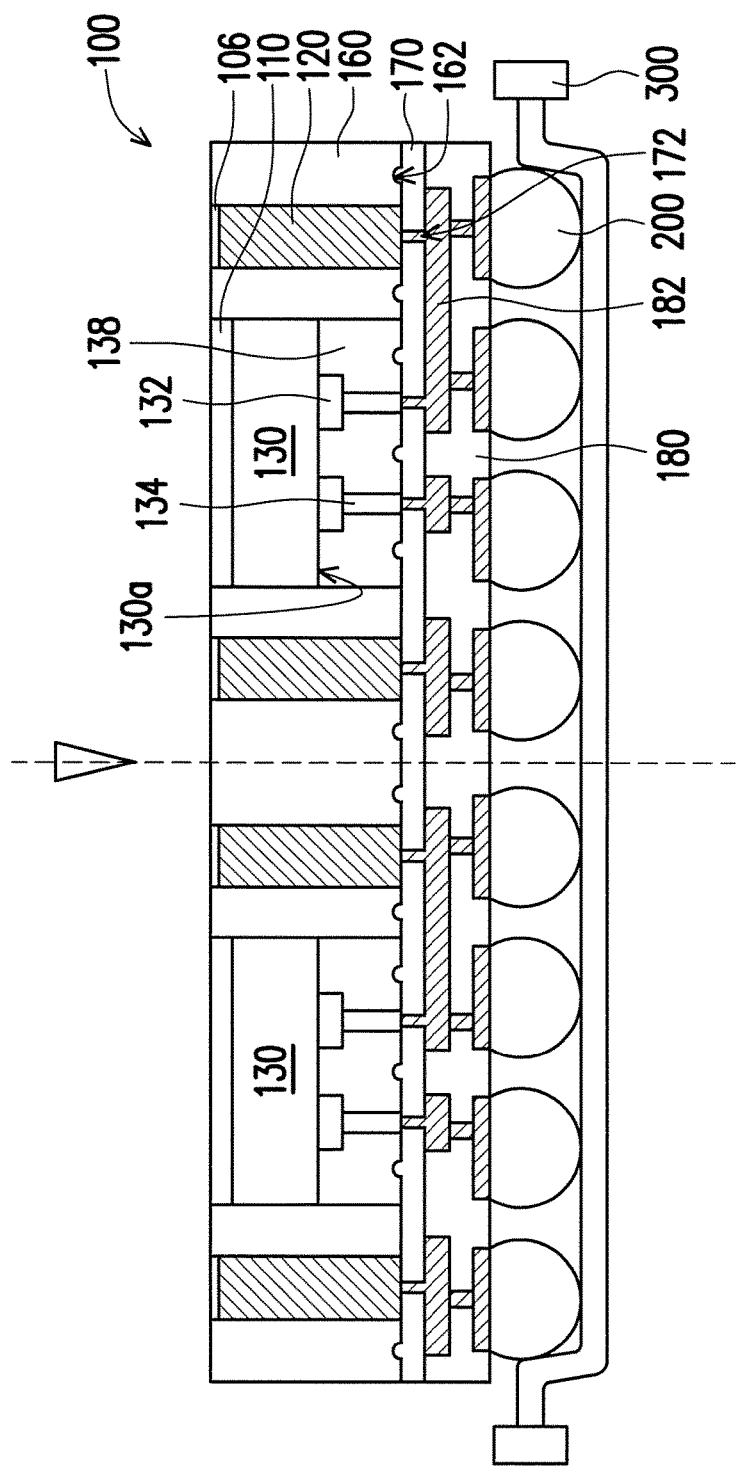

Referring to FIGS. 7D and 7E, in some embodiments, the whole package 100 is debonded from the carrier 102 to separate the first chips 130 from the carrier 102. In some embodiments, the semiconductor packages 10 includes the first chip 130, the TIVs 120, the molding compound 160, and the dielectric layer 170. The first chip 130 has the connectors such as the pads 132 and the metal posts 134 thereon. The TIVs 120 are disposed aside the first chip 130. The molding compound 160 at least encapsulates the first chips 130 and the TIVs 120, wherein the surface 160a of the molding compound 160 is substantially coplanar with the top surfaces of the TIVs 120, the top surfaces of the metal posts 134 and the top surface of the dielectric layer 138. The dielectric layer 170 is disposed over the first chip 130, the molding compound 160 and the TIVs 120. The material of the dielectric layer 170 is different from the material of the molding compound 160.

Figure 7F:
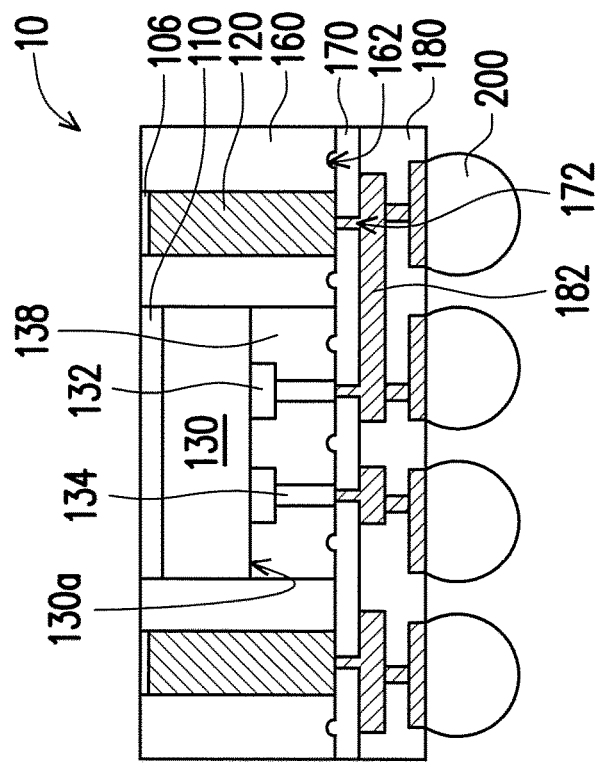

Referring to FIG. 7E, in some embodiments, the whole package 100 is turned upside down and disposed on a carrier film 300. Subsequently, in certain embodiments, a dicing process is performed to cut the whole package structure along the cutting line (the dotted line) into individual and separated semiconductor packages 10, as shown in FIG. 7F. It is noted that as the package structure is turned upside down, the top surfaces may become the bottom surfaces and the relative positional relationships (such as above, below, higher or lower) may become the opposite for the package structures as described above, but the same surfaces, common surfaces or interfaces will be marked with the same reference numbers for the individual semiconductor package(s) 10.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In some embodiments, the molding compound is formed with the top surface lower than the active surface of the chip, that is, the molding compound is not formed by an overmolding technique. Therefore, a planarization process for the molding compound is not required, and the pits concern caused by performing the planarization process on the molding compound including the fillers is prevented. Furthermore, the dielectric layer is formed over the molding compound and planarized to provide a better planar surface, beneficial for the later formed metal lines or wirings thereon, especially for metal lines with fine line/space. In addition, the planarization process performed on the dielectric layer also planarizes the connector (such as metal post) of the chip and the TIVs aside the chip, and the different height between the connector of the chip and the TIVs is eliminated and the solder removal process is able to be omitted. Moreover, the dielectric layer provides insulation for the connectors of the chips, and thus a passivation layer for the connectors of the chips are not required. In some embodiments, the pits are formed in the molding compound due to a planarization process, but the pits can be filled by the dielectric layer formed thereon. In addition, by a planarization process, the dielectric layer has a flatten surface, beneficial for the later formed metal lines or wirings thereon. In other words, formation of the molding compound and the dielectric layer covering the molding compound provides flexibility in material choices, larger process window for the molding compound and improved reliability for the redistribution layer having fine line/space and simplicity of the manufacturing method. Therefore, the cost of the semiconductor package may be lowered and the performance of the semiconductor package may be improved.

According to some embodiments, a semiconductor package includes a chip, a molding compound, and a dielectric layer. The chip has a connector thereon. The molding compound encapsulates the chip, wherein a surface of the molding compound is substantially lower than an active surface of the chip. The dielectric layer is disposed over the chip and the molding compound, wherein the dielectric layer has a planar surface, and a material of the dielectric layer is different from a material of the molding compound.

According to some embodiments, a semiconductor package includes a chip, through interlayer vias, a molding compound and a dielectric layer. The chip has a connector thereon. The through interlayer vias are disposed aside the chip. The molding compound at least encapsulates the chip and the through interlayer vias, wherein a surface of the molding compound is substantially lower than an active surface of the chip and surfaces of the through interlayer vias. The dielectric layer is disposed over the chip and the molding compound, wherein a surface of the dielectric layer is coplanar with the surfaces of the through interlayer vias, and a material of the dielectric layer is different from a material of the molding compound.

According to some embodiments, a manufacturing method for a semiconductor package is provided. A molding compound is formed to encapsulate a chip, wherein the chip has a connector formed thereon. A dielectric layer is formed to cover the chip and the molding compound. A planarization process is performed on the dielectric layer to remove a portion of the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
a chip having a connector thereon;
a molding compound, encapsulating the chip, wherein a surface of the molding compound is substantially lower than an active surface of the chip and has a dish-like depression; and
a dielectric layer, disposed over the chip and the molding compound, wherein the dielectric layer has a planar surface, and a material of the dielectric layer is different from a material of the molding compound.

2. The semiconductor package as claimed in claim 1, further comprising a redistribution layer disposed over the dielectric layer and electrically connected to the connector.

3. The semiconductor package as claimed in claim 1, wherein the connector comprises a pad and a metal post disposed on the pad, and a surface of the dielectric layer is substantially coplanar with a surface of the metal post.

4. The semiconductor package as claimed in claim 1, wherein the connector comprises a pad, and the dielectric layer comprises an opening to expose the pad.

5. The semiconductor package as claimed in claim 1, wherein the molding compound includes fillers.

6. The semiconductor package as claimed in claim 1, wherein the dielectric layer includes a material without containing fillers.

7. A semiconductor package, comprising:
a chip having a connector thereon;
through interlayer vias, disposed aside the chip;
a molding compound, at least encapsulating the chip and the through interlayer vias, wherein a surface of the molding compound is substantially lower than an active surface of the chip and surfaces of the through interlayer vias and has a dish-like depression; and
a dielectric layer, disposed over the chip and the molding compound, wherein a surface of the dielectric layer is coplanar with the surfaces of the through interlayer vias, and a material of the dielectric layer is different from a material of the molding compound.

8. The semiconductor package as claimed in claim 7, wherein the connector comprises a pad and a metal post disposed on the pad, and a surface of the metal post is substantially coplanar with the surfaces of the through interlayer vias.

9. The semiconductor package as claimed in claim 7, wherein the connector comprises a pad, and the dielectric layer comprises an opening to expose the pad.

10. The semiconductor package as claimed in claim 7, wherein the dielectric layer has a planar surface.

11. The semiconductor package as claimed in claim 7, wherein the dielectric layer includes a material without containing fillers.

12. A manufacturing method for a semiconductor packages, comprising:
forming a molding compound to encapsulate a chip, wherein the chip has a connector formed thereon, wherein a surface of the molding compound is substantially lower than an active surface of the chip and has a dish-like depression;
forming a dielectric layer to cover the chip and the molding compound; and
performing a planarization process on the dielectric layer to remove a portion of the dielectric layer.

13. The method as claimed in claim 12, wherein the connector comprises a pad, and the method further comprises forming an opening in the dielectric layer to expose the pad.

14. The method as claimed in claim 12, wherein the connector comprises a pad, a metal post over the pad, and a solder over the metal post, and the planarization process further removes the solder, so that a surface of the metal post and a surface of the dielectric layer are coplanar.

15. The method as claimed in claim 12, before forming the molding compound, further comprising forming through interlayer vias aside the chip, wherein the planarization process further removes a portion of the through interlayer vias, so that a surface of the dielectric layer is coplanar with surfaces of the through interlayer vias.

16. The method as claimed in claim 12, before forming the molding compound, further comprising forming through interlayer vias aside the chip, wherein the connector comprises a pad, a metal post on the pad, and a solder on the metal post, and the planarization process further removes the solder and a portion of the through interlayer vias, so that a surface of the dielectric layer, surfaces of the through interlayer vias, and a surface of the metal post are coplanar.

17. The method as claimed in claim 12, further comprising forming a redistribution layer over the dielectric layer.

18. The semiconductor package as claimed in claim 1, further comprising a conductive layer, wherein the conductive layer is disposed over the dielectric layer and extended into the dielectric layer to electrically connected to the connector.

19. The semiconductor package as claimed in claim 7, wherein a height of the molding compound adjacent to the chip is larger than a height of the molding compound adjacent to one of the through interlayer vias.

20. The semiconductor package as claimed in claim 7, further comprising a conductive layer, wherein the conductive layer is disposed over the dielectric layer and extended into the dielectric layer to electrically connected to the connector.

* * * * *